(12) United States Patent
Tanaka et al.

(10) Patent No.: US 7,581,335 B2
(45) Date of Patent: Sep. 1, 2009

(54) SUBSTRATE DRYING PROCESSING APPARATUS, METHOD, AND PROGRAM RECORDING MEDIUM

(75) Inventors: Hiroshi Tanaka, Tosu (JP); Hidetoshi Nakao, Tosu (JP); Naoki Shindo, Nirasaki (JP); Atushi Yamashita, Nirasaki (JP); Tsukasa Hirayama, Tosu (JP); Kotaro Tsurusaki, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 358 days.

(21) Appl. No.: 11/594,232

(22) Filed: Nov. 8, 2006

(65) Prior Publication Data

US 2007/0113423 A1 May 24, 2007

(30) Foreign Application Priority Data

Nov. 18, 2005 (JP) ............................. 2005-334538
Aug. 9, 2006 (JP) ............................. 2006-216464

(51) Int. Cl.
*F26B 7/00* (2006.01)

(52) U.S. Cl. ............................. 34/391; 34/413; 34/486; 34/497; 34/77; 34/78; 34/80; 134/7; 134/11; 134/61; 134/902; 118/900

(58) Field of Classification Search ................... 34/391, 34/413, 443, 486, 497, 77, 78, 80, 210, 218; 134/7, 11, 61, 902; 118/900
See application file for complete search history.

(56) References Cited

U.S. PATENT DOCUMENTS

| | | | | |
|---|---|---|---|---|
| 2,174,170 A * | 9/1939 | Schweizer | .................. | 427/243 |
| 2,376,095 A * | 5/1945 | Shoeld | ..................... | 34/473 |
| 2,443,443 A * | 6/1948 | Marc | .................. | 34/77 |
| 3,218,728 A * | 11/1965 | Barth et al. | .................. | 34/292 |
| 3,396,477 A * | 8/1968 | Nora | .................. | 34/85 |
| 4,150,494 A * | 4/1979 | Rothchild | .................. | 34/469 |
| 4,497,121 A * | 2/1985 | Choinski | .................. | 34/445 |
| 4,777,970 A * | 10/1988 | Kusuhara | .................. | 134/66 |
| 4,860,547 A * | 8/1989 | Maldague | .................. | 62/86 |
| 4,876,802 A * | 10/1989 | Gergely et al. | .................. | 34/408 |
| 5,105,557 A * | 4/1992 | Vadasz et al. | .................. | 34/401 |
| 5,361,514 A * | 11/1994 | Lahoda et al. | .................. | 34/391 |
| 5,443,540 A * | 8/1995 | Kamikawa | .................. | 34/471 |
| 5,520,744 A * | 5/1996 | Fujikawa et al. | .................. | 134/11 |
| 5,571,337 A * | 11/1996 | Mohindra et al. | .................. | 134/7 |

(Continued)

FOREIGN PATENT DOCUMENTS

JP     11-186212     7/1999

*Primary Examiner*—Stephen M. Gravini
(74) *Attorney, Agent, or Firm*—Smith, Gambrell & Russell, LLP

(57) ABSTRACT

The present invention provides a drying apparatus capable of satisfactorily drying a workpiece by using a dry vapor The drying apparatus has a control device for controlling a supply of a carrier gas and a supply of a dry vapor into a processing tank holding workpieces. A drying process carries out a carrier gas supply step of supplying the carrier gas and a mixed fluid supply step of supplying a mixed fluid prepared by mixing the carrier gas and the dry vapor alternately. A total mixed fluid supply time for which the mixed fluid supply step is executed is not shorter than 57% of a total processing time for which the carrier gas supply step and the mixed fluid supply step are executed.

16 Claims, 15 Drawing Sheets

U.S. PATENT DOCUMENTS

| | | | |
|---|---|---|---|
| 5,634,978 A * | 6/1997 | Mohindra et al. | 134/2 |
| 5,675,909 A * | 10/1997 | Pare | 34/265 |
| 5,715,612 A * | 2/1998 | Schwenkler | 34/470 |
| 5,732,476 A * | 3/1998 | Pare | 34/265 |
| 5,749,159 A * | 5/1998 | Schwenkler | 34/426 |
| 5,752,532 A * | 5/1998 | Schwenkler | 134/102.3 |
| 5,884,640 A * | 3/1999 | Fishkin et al. | 134/95.2 |
| 5,906,862 A * | 5/1999 | Yapel et al. | 427/378 |
| 5,940,985 A * | 8/1999 | Kamikawa et al. | 34/471 |
| 5,950,322 A * | 9/1999 | Knabe | 34/86 |
| 5,950,328 A * | 9/1999 | Ichiko et al. | 34/364 |
| 5,954,911 A * | 9/1999 | Bergman et al. | 156/345.29 |
| 5,964,958 A * | 10/1999 | Ferrell et al. | 134/26 |
| 5,985,041 A * | 11/1999 | Florez | 134/2 |
| 6,128,830 A * | 10/2000 | Bettcher et al. | 34/404 |
| 6,131,307 A * | 10/2000 | Komino et al. | 34/486 |
| 6,158,141 A * | 12/2000 | Asada et al. | 34/74 |
| 6,165,277 A * | 12/2000 | Florez | 134/2 |
| 6,207,020 B1 * | 3/2001 | Anderson | 162/207 |
| 6,216,709 B1 * | 4/2001 | Fung et al. | 134/25.4 |
| 6,219,936 B1 * | 4/2001 | Kedo et al. | 34/381 |
| 6,286,231 B1 * | 9/2001 | Bergman et al. | 34/410 |
| 6,357,142 B1 * | 3/2002 | Bergman et al. | 34/410 |
| 6,375,758 B1 * | 4/2002 | Nakashima et al. | 134/30 |
| 6,401,361 B1 * | 6/2002 | Chen et al. | 34/467 |
| 6,430,840 B1 * | 8/2002 | Jung | 34/468 |
| 6,446,355 B1 * | 9/2002 | Jones et al. | 34/245 |
| 6,477,786 B1 * | 11/2002 | Jones et al. | 34/228 |
| 6,543,156 B2 * | 4/2003 | Bergman et al. | 34/410 |
| 6,605,254 B2 * | 8/2003 | Aguilera et al. | 422/28 |
| 6,615,510 B2 * | 9/2003 | Jones et al. | 34/448 |
| 6,625,901 B1 * | 9/2003 | Mehmandoust et al. | 34/476 |
| 6,655,042 B2 * | 12/2003 | Yi et al. | 34/340 |
| 6,670,402 B1 * | 12/2003 | Lee et al. | 516/111 |
| 6,691,430 B2 * | 2/2004 | Saito et al. | 34/389 |
| 6,695,926 B1 * | 2/2004 | Koyanagi et al. | 134/2 |
| 6,722,056 B2 * | 4/2004 | Myland | 34/381 |
| 6,729,040 B2 * | 5/2004 | Mehmandoust | 34/443 |
| 6,745,494 B2 * | 6/2004 | Bergman et al. | 34/410 |
| 6,790,291 B2 * | 9/2004 | Kimura | 134/30 |
| 6,896,743 B2 * | 5/2005 | Jung et al. | 134/26 |
| 6,901,685 B2 * | 6/2005 | Yamaguchi et al. | 34/487 |
| 6,928,748 B2 * | 8/2005 | Chen et al. | 34/445 |
| 6,988,327 B2 * | 1/2006 | Garcia et al. | 34/407 |
| 7,093,375 B2 * | 8/2006 | O'Donnell | 34/79 |
| 7,127,831 B2 * | 10/2006 | Garcia et al. | 34/407 |
| 7,181,863 B2 * | 2/2007 | Ferrell et al. | 34/340 |
| 7,186,299 B2 * | 3/2007 | Park et al. | 134/26 |
| 7,191,547 B2 * | 3/2007 | Wiedl et al. | 34/264 |
| 7,343,922 B2 * | 3/2008 | Jung et al. | 134/95.2 |
| 7,363,727 B2 * | 4/2008 | O'Donnell | 34/380 |
| 7,377,053 B1 * | 5/2008 | Maeda et al. | 34/445 |
| 7,395,611 B2 * | 7/2008 | Garcia et al. | 34/77 |
| 7,437,834 B2 * | 10/2008 | Nakatsukasa et al. | 34/381 |
| 7,513,062 B2 * | 4/2009 | Achkire et al. | 34/482 |
| 2001/0008181 A1 * | 7/2001 | Anderson | 162/204 |
| 2001/0047595 A1 * | 12/2001 | Mehmandoust | 34/443 |
| 2002/0026729 A1 * | 3/2002 | Bergman et al. | 34/410 |
| 2002/0032973 A1 * | 3/2002 | Jung | 34/467 |
| 2002/0069899 A1 * | 6/2002 | Verhaverbeke et al. | 134/30 |
| 2002/0095816 A1 * | 7/2002 | Bergman et al. | 34/415 |
| 2003/0000673 A1 * | 1/2003 | Anderson | 162/207 |
| 2003/0088995 A1 * | 5/2003 | Bergman et al. | 34/415 |
| 2003/0106239 A1 * | 6/2003 | Yi et al. | 34/444 |
| 2003/0121170 A1 * | 7/2003 | Achkire et al. | 34/78 |
| 2004/0060190 A1 * | 4/2004 | Lee | 34/59 |
| 2004/0060195 A1 * | 4/2004 | Garcia et al. | 34/445 |
| 2005/0091874 A1 * | 5/2005 | Chen et al. | 34/445 |
| 2005/0268481 A1 * | 12/2005 | Wiedl et al. | 34/416 |
| 2006/0150435 A1 * | 7/2006 | Garcia et al. | 34/381 |
| 2006/0150436 A1 * | 7/2006 | Tada et al. | 34/402 |
| 2007/0006483 A1 * | 1/2007 | Kamikawa et al. | 34/467 |
| 2007/0011905 A1 * | 1/2007 | Garcia et al. | 34/381 |
| 2007/0113423 A1 * | 5/2007 | Tanaka et al. | 34/486 |
| 2007/0144027 A1 * | 6/2007 | Renaud | 34/60 |
| 2007/0175062 A1 * | 8/2007 | Toshima et al. | 34/410 |
| 2008/0052947 A1 * | 3/2008 | Miya | 34/317 |

* cited by examiner

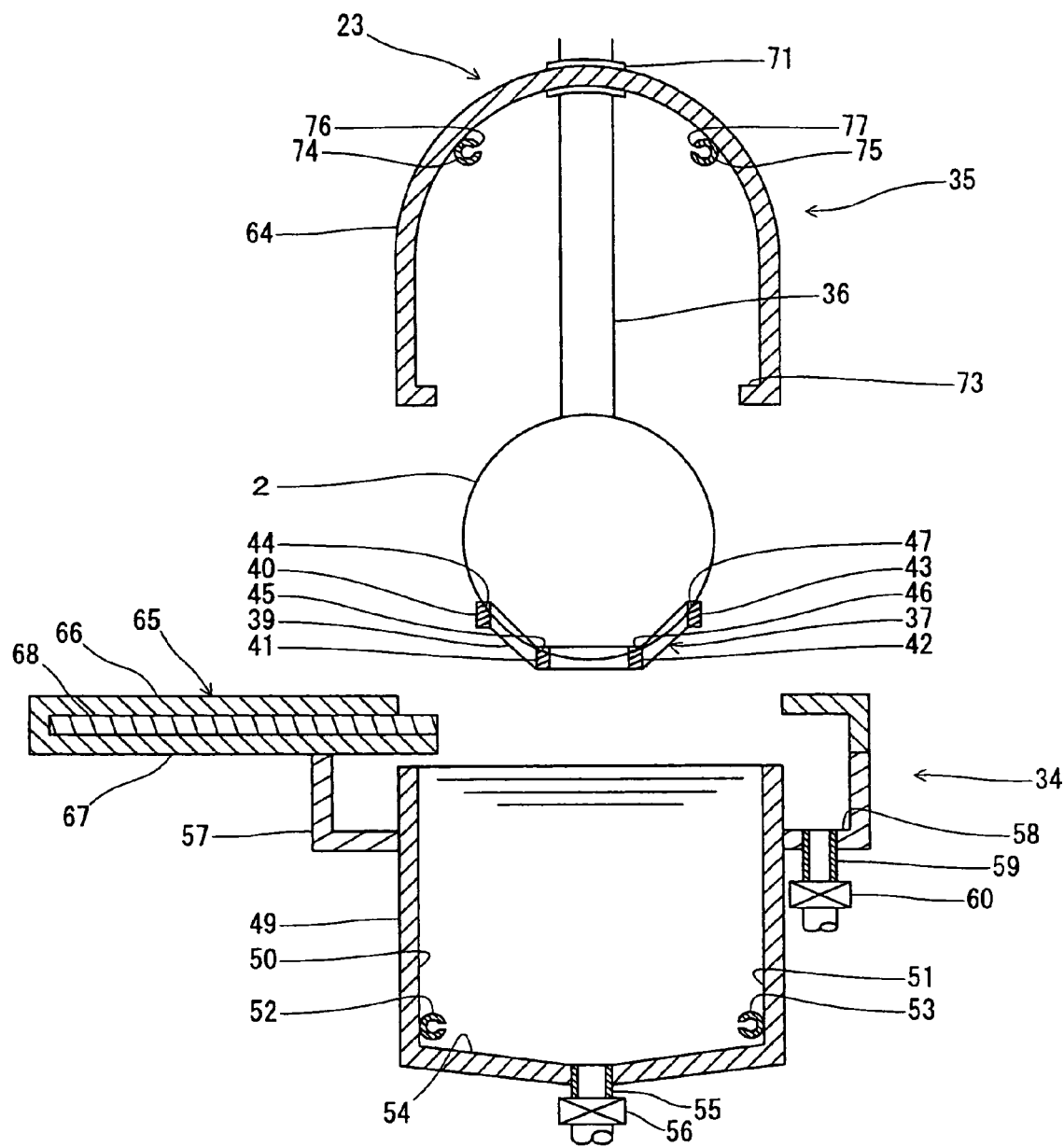
F I G . 7

SUBSTRATE DRYING PROCESSING APPARATUS, METHOD, AND PROGRAM RECORDING MEDIUM

BACKGROUND OF THE INVENTION

1. Field of the Invention

The present invention relates to a drying apparatus for processing a workpiece, such as a semiconductor wafer, a liquid crystal panel or the like, by a drying process, and a substrate processing system (a substrate processing apparatus) including the drying apparatus. The present invention relates also to a drying method of drying a workpiece, such as a semiconductor wafer, a liquid crystal panel or the like, by a drying process and a substrate processing method. The present invention relates also to a storage medium (a program recording medium) storing a program specifying a drying method of processing a workpiece, such as a semiconductor wafer, a liquid crystal panel or the like, by a drying process.

2. Description of the Related Art

A manufacturing process for manufacturing a semiconductor device, a flat display or the like includes a drying step of processing a workpiece processed by a cleaning process, such as a semiconductor wafer, a liquid crystal panel or the like, by a drying process. A known drying apparatus used in the drying step is disclosed in, for example, the Japanese Patent Laid-Open Publication No. 11-186212. This known drying apparatus supplies a dry vapor for drying a workpiece, such as IPA gas (isopropyl alcohol gas), together with a carrier gas, such as nitrogen gas, into a processing tank. The dry vapor comes into contact with the surface of the workpiece in the processing tank to dry the workpiece.

The known drying apparatus has a drying tank and a dry vapor supply nozzle placed on the drying tank. The drying gas supply nozzle is connected through a mixing device to a dry vapor source and a carrier gas source. This drying apparatus supplies the dry vapor and the carrier gas simultaneously and continuously through the drying gas supply nozzle into the processing tank. The dry vapor comes into contact with the surface of the workpiece in the processing tank so as to dry the workpiece.

Since this drying apparatus supplies the dry vapor and the carrier gas simultaneously and continuously into the processing tank, the high-temperature, high-concentration, gaseous dry vapor can be continuously blown against the surface of the workpiece and it is possible that the dry vapor condenses on the surface of the workpiece if the high-temperature, high-concentration dry vapor is blown continuously against the surface of the workpiece. The surface of the workpiece may possibly be contaminated if the dry vapor condenses on the surface of the workpiece.

When a wafer, in particular, is processed as a workpiece, contaminants, such as particles and metals or organic impurities, adhered to an unusable peripheral area of the surface of the wafer when the wafer is chucked for carrying may flow together with the condensate of the dry vapor from the unusable peripheral area to an usable inner area, in which devices are formed, of the surface of the wafer and the usable inner area may be contaminated with the contaminants.

SUMMARY OF THE INVENTION

A drying apparatus according to the present invention includes: a processing tank to receive a workpiece; a fluid supply mechanism joined to the processing tank to supply a carrier gas and a dry vapor into the processing tank; and a control device for controlling a supply of the carrier gas and a supply of the dry vapor by the fluid supply mechanism so as to process the workpiece placed in the processing tank such that a carrier gas supply step of supplying the carrier gas while stopping the supply of the dry vapor and a mixed fluid supply step of supplying the carrier gas while supplying the dry vapor are executed alternately, and a total mixed fluid supply time for which the mixed fluid supply step is executed is not shorter than 57% of a total processing time for which the carrier gas supply step and the mixed fluid supply step are executed.

In the drying apparatus according to the present invention, the mixed fluid including the carrier gas and the dry vapor can be supplied intermittently. Consequently, the dry vapor is delivered intermittently against the workpiece and hence the dry vapor is prevented from condensing on the surface of the workpiece. Thus it is possible to prevent the contamination of the workpiece resulting from the condensation of the dry vapor on the surfaces of the workpiece.

A substrate processing system includes: a cleaning tank to receive a workpiece and to clean the workpiece; a drying tank to receive the workpiece and to dry the cleaned workpiece received therein; a fluid supply mechanism joined to the drying tank to supply a carrier gas and a dry vapor into the drying tank; and a control device for controlling a supply of the carrier gas and a supply of the dry vapor by the fluid supply mechanism to dry the workpiece placed in the drying tank such that a carrier gas supply step of supplying the carrier gas while stopping the supply of the dry vapor and a mixed fluid supply step of supplying the carrier gas while supplying the dry vapor are executed alternately, and a total mixed fluid supply time for which the mixed fluid supply step is executed is not shorter than 57% of a total processing time for which the carrier gas supply step and the mixed fluid supply step are executed.

In the substrate processing system according to the present invention, the mixed fluid including the carrier gas and the dry vapor can be supplied intermittently. Consequently, the dry vapor is delivered intermittently against the workpiece and hence the dry vapor is prevented from condensing on the surfaces of the workpiece. Thus it is possible to prevent the contamination of the workpiece resulting from the condensation of the dry vapor on the surfaces of the workpiece.

In the drying apparatus and the substrate processing system according to the present invention, the supply of the carrier gas and the supply of the dry vapor may be controlled such that the total mixed fluid supply time for which the mixed fluid supply step is executed is not shorter than 75% of the total processing time for which the carrier gas supply step and the mixed fluid supply step are executed. According to this drying apparatus and this substrate processing system, it is possible to satisfactorily dry the workpiece.

In the drying apparatus and the substrate processing system according to the present invention, the supply of the carrier gas and the supply of the dry vapor may be controlled such that the total mixed fluid supply time for which the mixed fluid supply step is executed is not longer than 83% of the total processing time for which the carrier gas supply step and the mixed fluid supply step are executed. According to this drying apparatus and this substrate processing system, it is possible to prevent the condensation of the dry vapor on the surfaces of the workpiece and to satisfactorily dry the workpiece.

In the drying apparatus and the substrate processing system according to the present invention, the supply of the carrier gas and the supply of the dry vapor may be controlled such that the carrier gas supply step and the mixed fluid supply step are executed continuously and alternately. According to this drying apparatus and this substrate processing system, it is possible to continuously supply the carrier gas into the processing tank. Consequently, the flow of gases in the processing tank can be stabilized. Particles are thus prevented from being flung up and from adhering again to the workpiece.

In the drying apparatus and the substrate processing system according to the present invention, the fluid supply mechanism may include: a gas supply pipe extending to the processing tank to supply the carrier gas into the processing tank; a chemical source to supply a chemical, the chemical to be evaporated to generate the dry vapor; a chemical supply pipe joined to the chemical source and a middle part of the gas supply pipe; a heating mechanism placed in a part of the gas supply pipe on the downstream side of a joint of the chemical supply pipe and the gas supply pipe to heat a fluid flowing through the gas supply pipe; and an intermittent chemical supply mechanism placed in the chemical supply pipe to supply the chemical intermittently into the gas supply pipe from the chemical supply pipe. According to this drying apparatus and this substrate processing system, the chemical can be stably evaporated so as to generate the dry vapor. In this drying apparatus and this substrate processing system, the fluid supply mechanism may further include a preheating mechanism placed in a part of the gas supply pipe on the upstream side of the joint of the gas supply pipe and the chemical supply pipe to heat the carrier gas flowing through the gas supply pipe. According to this drying apparatus and this substrate processing system, the chemical can be more stably evaporated so as to generate the dry vapor. In this drying apparatus and this substrate processing system, the gas supply pipe may be branched into a plurality of branch pipes; an end of the chemical supply pipe may be branched into a plurality of branch pipes; the branch pipes of the chemical supply pipe may be connected to the branch pipes of the gas supply pipe, respectively; the heating mechanism may comprise a plurality of heating mechanisms; and the heating mechanisms may be placed in the branch pipes of the gas supply pipe, respectively. According to this drying apparatus and this substrate processing system, the chemical can be more stably evaporated so as to generate the dry vapor.

A drying method according to the present invention includes the steps of; placing a workpiece in a processing tank; and drying the workpiece by intermittently supplying a mixed fluid including a carrier gas and a dry vapor into the processing tank in which the workpiece is placed; wherein the step of drying the workpiece includes a carrier gas supply step of supplying the carrier gas while stopping the supply of the dry vapor, and a mixed fluid supply step of supplying the carrier gas while supplying the dry vapor, the carrier gas supply step and the mixed fluid supply step are executed alternately, and a total mixed fluid supply time for which the mixed fluid supply step is executed is not shorter than 57% of a total processing time for which the carrier gas supply step and the mixed fluid supply step are executed.

In the drying method according to the present invention, the mixed fluid including the carrier gas and the dry vapor can be supplied intermittently. Consequently, the dry vapor comes into contact with the workpiece intermittently and hence the dry vapor can be preventing from condensing on the surfaces of the workpiece. Thus it is possible to prevent the contamination of the workpiece resulting from the condensation of the dry vapor on the surfaces of the workpiece.

A substrate processing method according to the present invention includes the steps of: placing a workpiece in a cleaning tank; cleaning the workpiece placed in the cleaning tank; placing the cleaned workpiece in a drying tank; and drying the workpiece by intermittently supplying a mixed fluid including a carrier gas and a dry vapor into the drying tank in which the workpiece is placed; wherein the step of drying the workpiece includes a carrier gas supply step of supplying the carrier gas while stopping the supply of the dry vapor, and a mixed fluid supply step of supplying the carrier gas while supplying the dry vapor, the carrier gas supply step and the mixed fluid supply step are executed alternately, and a total mixed fluid supply time for which the mixed fluid supply step is executed is not shorter than 57% of a total processing time for which the carrier gas supply step and the mixed fluid supply step are executed.

In the substrate processing method according to the present invention, the mixed fluid including the carrier gas and the dry vapor can be supplied intermittently. Consequently, the dry vapor comes into contact with the workpiece intermittently and hence the dry vapor can be preventing from condensing on the surfaces of the workpiece. Thus it is possible to prevent the contamination of the workpiece resulting from the condensation of the dry vapor on the surfaces of the workpiece.

In the drying method and the substrate processing method according to the present invention, the total mixed fluid supply time for which the mixed fluid supply step may be executed is not shorter than 75% of the total processing time for which the carrier gas supply step and the mixed fluid supply step are executed. According to this drying method and this substrate processing method, it is possible to satisfactorily dry the workpiece.

In the drying method and the substrate processing method according to the present invention, the total mixed fluid supply time for which the mixed fluid supply step may be executed is not longer than 83% of the total processing time for which the carrier gas supply step and the mixed fluid supply step are executed. According to this drying method and this substrate processing method, it is possible to prevent the condensation of the dry vapor on the surfaced of the workpiece and to satisfactorily dry the workpiece.

In the drying method and the substrate processing method according to the present invention, during the step of drying the workpiece, the carrier gas may be supplied continuously and the dry vapor may be supplied intermittently whereby the mixed fluid may be supplied intermittently. According to this drying method and this substrate processing method, it is possible to continuously supply the carrier gas into the processing tank. Consequently, the flow of gases in the processing tank can be stabilized. Particles are thus prevented from being flung up and from adhering again to the workpiece.

In the drying method and the substrate processing method according to the present invention, the mixed fluid supplied into the processing tank may be produced by mixing a chemical to be evaporated to generate the dry vapor and the carrier gas, and heating the chemical and the carrier gas so as to evaporate the chemical. According to this drying method and this substrate processing method, the chemical can be stably evaporated so as to generate the dry vapor. In this drying method and this substrate processing method, the carrier gas may be preheated before the carrier gas and the chemical are mixed. According to this drying method and this substrate processing method, the chemical can be more stably evaporated so as to generate the dry vapor.

A storage medium according to the present invention stores a program to be carried out by a control device for controlling a drying apparatus including a processing tank to receive a workpiece, and a fluid supply mechanism to supply a carrier gas and a dry vapor into the processing tank. The control device is capable of carrying out the program to accomplish a substrate drying method including the steps of: placing a workpiece in the processing tank; and drying the workpiece by intermittently supplying a mixed fluid including a carrier gas and a dry vapor into the processing tank in which the workpiece is placed; wherein the step of drying the workpiece includes a carrier gas supply step of supplying the carrier gas while stopping the supply of the dry vapor and a mixed fluid supply step of supplying the carrier gas while supplying the dry vapor, the carrier gas supply step and the mixed fluid supply step are executed alternately, and a total mixed fluid supply time for which the mixed fluid supply step is executed is not shorter than 57% of a total processing time for which the carrier gas supply step and the mixed fluid supply step are executed.

BRIEF DESCRIPTION OF THE DRAWINGS

FIG. 7 is a sectional view for explaining cleaning operations of the substrate cleaning and drying unit at a wafer receiving stage;

DESCRIPTION OF THE PREFERRED EMBODIMENTS

A drying apparatus, a substrate processing system (a substrate processing apparatus), a drying method, a substrate processing method and a program storage medium (a program recording medium) embodying the present invention will be described with reference to the accompanying drawings. The present invention will be described as applied to a substrate processing system for cleaning and drying semiconductor substrates (wafers) as workpieces.

Figure 1:
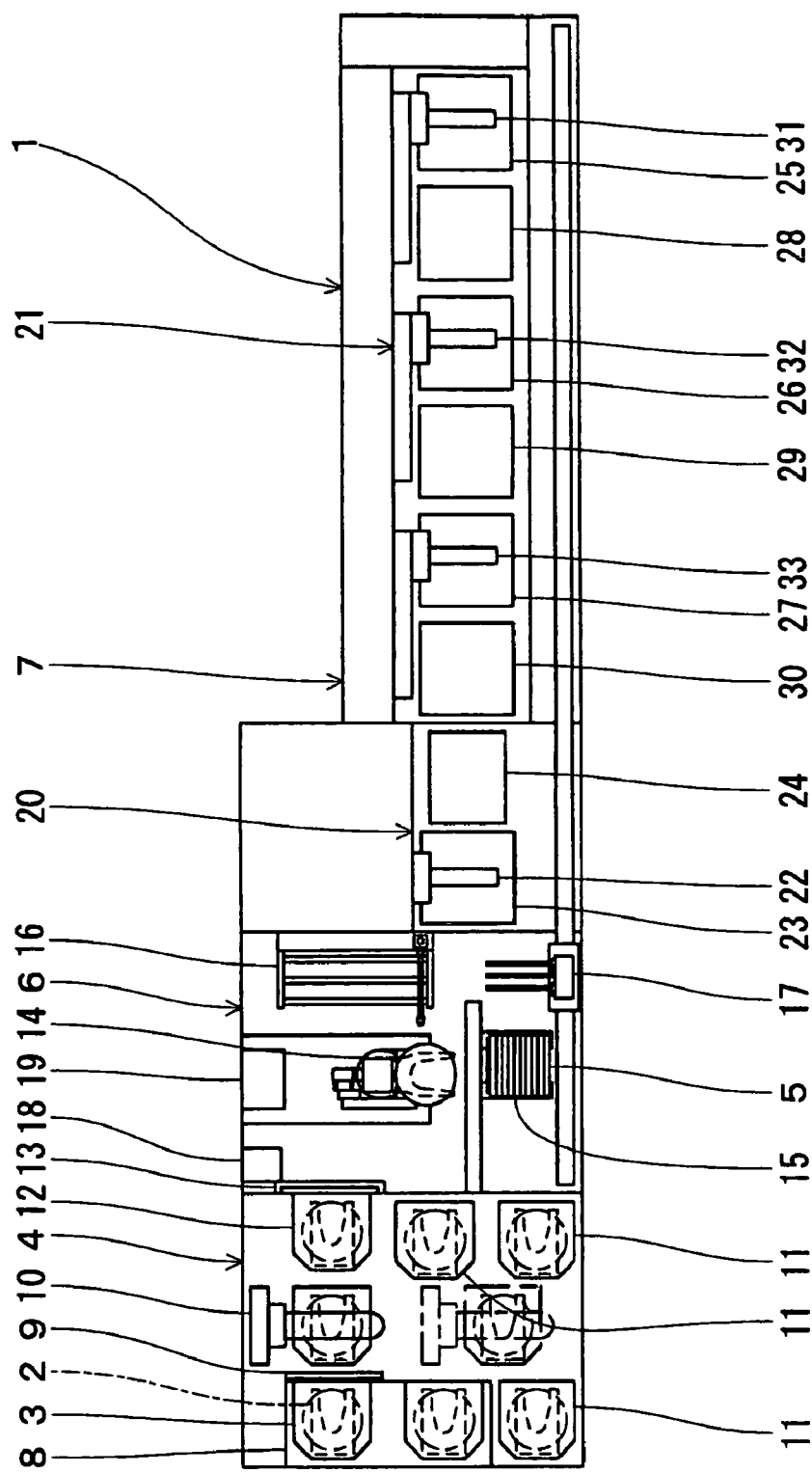
FIG. 1 is a top view of a substrate processing system in a preferred embodiment according to the present invention.

Referring to FIG. 1, a substrate processing system 1 includes a carrier handling block 4 for receiving a carrier 3 containing a plurality of wafers 2 (substrates) and sending out the carrier 3, a batch forming block 6 for forming a batch 5 of wafers 2 for batch processing by combining wafers 2 contained in a plurality of carriers 3, and a substrate processing block 6 for processing the wafers 2 of each batch 5 by a cleaning process and a drying process.

The carrier handling block 4 has a carrier stage 8 and a carrier support table 12 on which carriers 3 are placed and which support a carrier 3, and a carrier carrying mechanism 10 for carrying a carrier between the carrier stage 8 and the carrier support table 12. Wafers 2 contained in a carrier 3 supported on the carrier support table 12 are transferred to the batch forming block 6. The carrier carrying mechanism 10 and the carrier support table 12 are disposed in a sealed space isolated from the surroundings. A carrier 3 is transferred between the sealed space and the carrier stage 8 through an opening normally sealed by an openable and closable sealing door 9. Carrier holding tables 11 are disposed in the sealed space to keep a carrier temporarily when necessary.

A carrier 3 containing wafers 2 to be processed is placed on the carrier stage 8. The carrier carrying mechanism 10 carries the carrier 3 through the opening opened by opening the sealing door 9 to the carrier support table 12. When necessary, the carrier 3 is kept temporarily on the carrier holding table 11 before being carried to the carrier support table 12. A carrier 3 containing wafers 2 processed by the substrate processing block 7 is placed on the carrier support table 12. The carrier carrying mechanism 10 carries the carrier 3 containing the processed wafers 2 through the opening opened by opening the sealing door 9 to the carrier stage 8. When necessary, the carrier 3 containing the processed wafers 2 is also kept temporarily on the carrier holding table 11 before being carried to the carrier stage 8.

The batch forming block 6 includes: a substrate carrying mechanism 14 for simultaneously carrying a plurality of wafers 2 contained in a carrier 3; a batch forming mechanism 15 for forming a batch 5 by arranging the wafers 2 delivered thereto by the substrate carrying mechanism 14 at regular intervals equal to half the intervals at which the wafers 2 are arranged on the substrate carrying mechanism 14; a substrate rearranging mechanism 16 for changing the arranging order of the wafers 2 in which the wafers 2 are arranged on the substrate carrying mechanism 14; and a batch carrying mechanism 17 for carrying the batch 5 formed by the batch forming mechanism 15 in the batch forming block 6 and the substrate processing block 7. The mechanisms 14, 15, 16 and 17 of the batch forming block 6, as well as devices and mechanisms included in the substrate processing block 7 are disposed in a sealed space isolated from the surroundings. Wafers 2 are transferred between the sealed space and the carrier support table 12 of the carrier handling block 4 through an opening normally sealed by an openable and closable sealed door 13. The batch forming block 6 has a wafer detector 18 for determining whether a carrier contains the wafers 2 or not, and a notch aligner 19 for adjusting the respective positions of notches formed respectively in a plurality of wafers 2 contained in a carrier 3. The wafer detector 18 and the notch aligner 19 are disposed in the sealed space.

The batch forming block 6 combines a plurality of wafers 2, for example fifty wafers 2, contained in a plurality of carriers 3, for example two carriers 3, each containing a plurality of wafers 2, for example, twenty-five wafers 2, so as to form a batch 5 of a plurality of wafers 2, for example fifty wafers 2, to be processed in a batch by the substrate processing block 7. The batch carrying mechanism 17 carries the batch 5 to the substrate processing block 7. The batch carrying mechanism 17 carries the batch 5 of the wafers 2 processed by the substrate processing block 7 from the substrate processing block 7 to the batch forming block 6. The wafers 2 of the processed batch 5 are returned to their carriers 3.

The substrate processing block 7 has a cleaning and drying mechanism 20 for cleaning and drying wafers 2, and a cleaning mechanism 21 for cleaning wafers 2. The cleaning and drying mechanism 20 has: a wafer lifting mechanism 22 for vertically moving a batch 5; a substrate cleaning and drying unit 23 for processing the batch held by the wafer lifting mechanism 22 by a cleaning process and a drying process; and a carrying mechanism cleaning device 24 for cleaning the batch carrying mechanism 17. In the substrate processing system 1 shown in FIG. 1, the substrate cleaning and drying unit 23 and the carrying mechanism cleaning device 24 are arranged side by side. The cleaning mechanism 21 has chemical solution tanks for processing a batch 5 with a chemical solution, namely, a first chemical solution tank 25, a second chemical solution tank 26 and a third chemical solution tank 27, pure water tanks for cleaning a batch 5 with pure water, namely, a first pure water tank 28, a second pure water tank 29 and a third pure water tank 30, and carrying devices for carrying a batch 5 between the adjacent ones of the chemical solution tanks 25, 26 and 27 and the pure water tanks 28, 29 and 30, namely, a first carrying device 31, a second carrying device 32 and a third carrying device 33.

As shown in FIG. 1, the batch carrying mechanism 17 can move along the arrangement of the cleaning and drying mechanism 20 and the cleaning mechanism 21. A starting terminal of the batch carrying mechanism 17 is in the batch forming block 6.

The batch carrying mechanism 17 carries a batch 5 formed by the batch forming block 6 to the wafer lifting mechanism 22 of the cleaning and drying mechanism 20 and to the carrying devices 31, 32 and 33 of the cleaning mechanism 21. The cleaning and drying mechanism 20 and the cleaning mechanism 21 process the wafers 2 included in a batch 5 delivered thereto in a batch processing mode. The processed batch 5 is transferred from the wafer lifting mechanism 22 of the cleaning and drying mechanism 20 and the carrying devices 31, 32 and 33 of the cleaning mechanism 21 to the batch carrying mechanism 17. The batch carrying mechanism 17 returns the processed batch 5 to the batch forming block 6.

According to the substrate processing system 1 in this embodiment, a carrier 3 containing wafers 2 is carried from the carrier handling block 4 to the batch forming block 6. The batch forming block 6 combines the wafers 2 delivered thereto in order to form a batch 5 to be processed in a batch processing mode in the substrate processing block 7. The batch 5 is transferred to the substrate processing block 7. In the substrate processing block 7, the wafers 2 included in the batch 5 are processed in a batch processing mode. The processed batch 5 is transferred to the batch forming block 6. In the batch forming block 6, the wafers 2 included in the processed batch 5 are returned into the carriers 3. The carrier 3 containing the processed wafers 2 is carried from the batch forming block 6 to the carrier handling block 4. Then, the carrier 3 containing the processed wafers 2 is sent out from the carrier handling block 4.

The substrate cleaning and drying unit 23 will be described.

Figure 2:
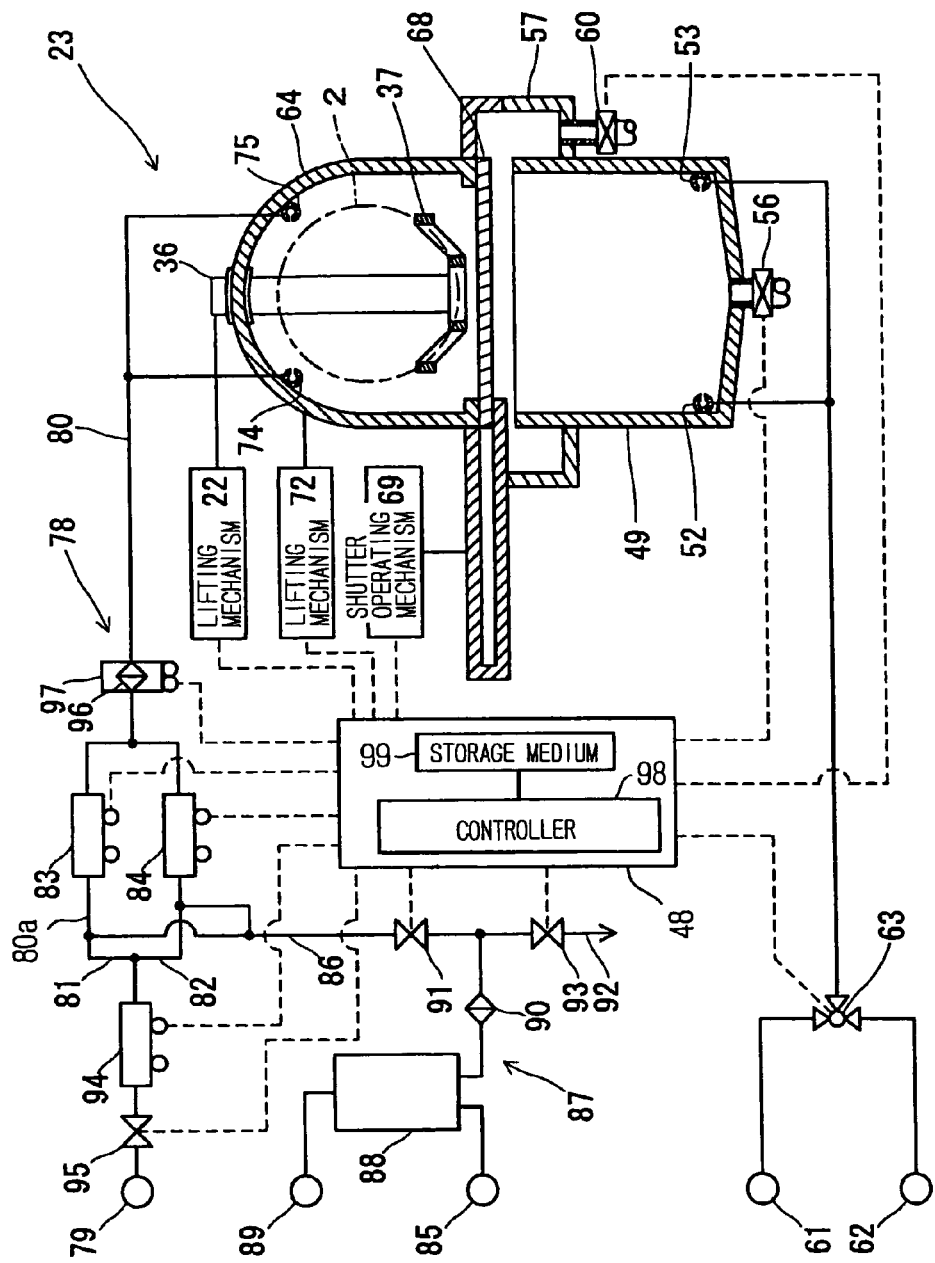
FIG. 2 is a diagrammatic view of a substrate cleaning and drying unit including a drying apparatus in a preferred embodiment according to the present invention.
Figure 3:
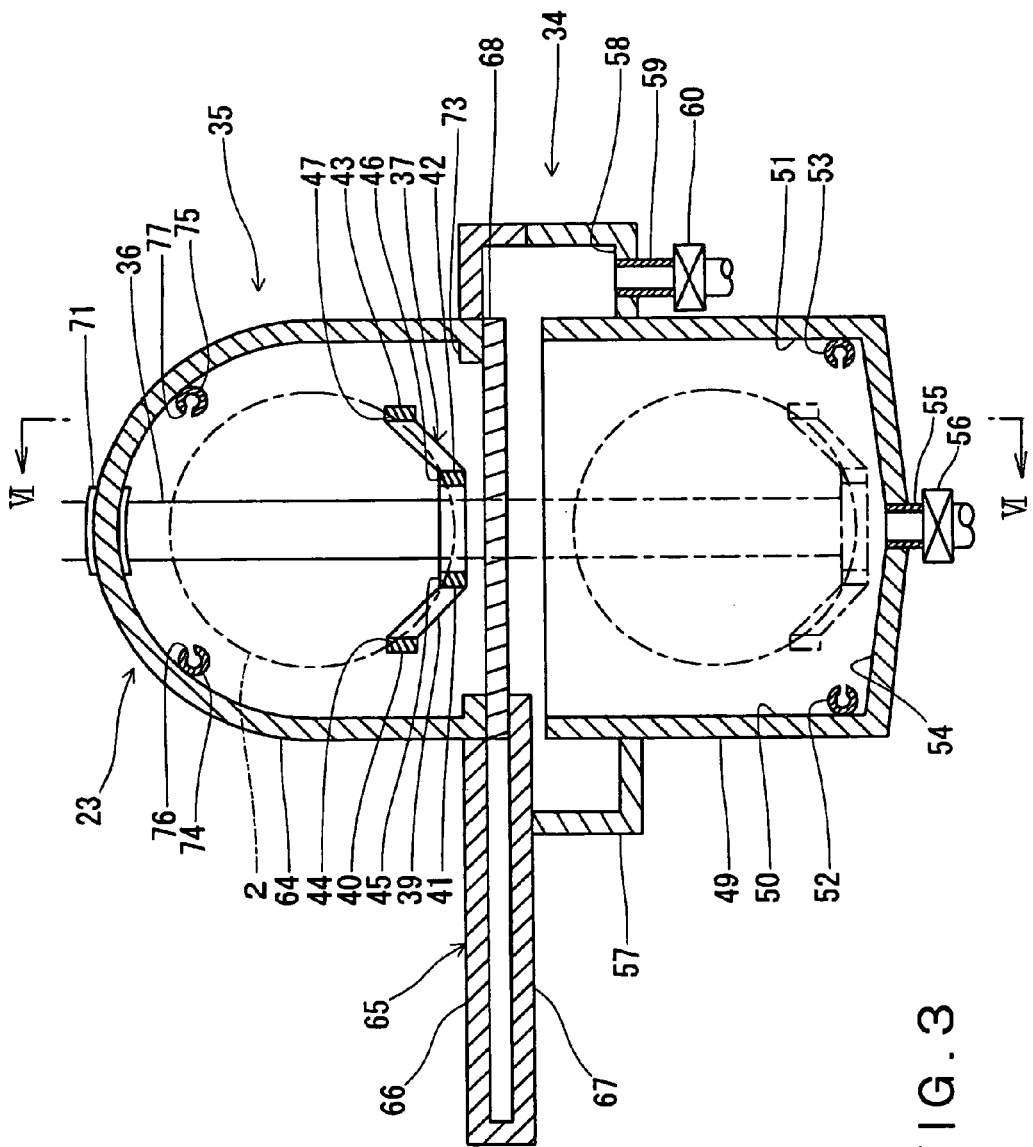
FIG. 3 is a longitudinal sectional view of the substrate cleaning and drying unit shown in FIG. 2.
Figure 4:
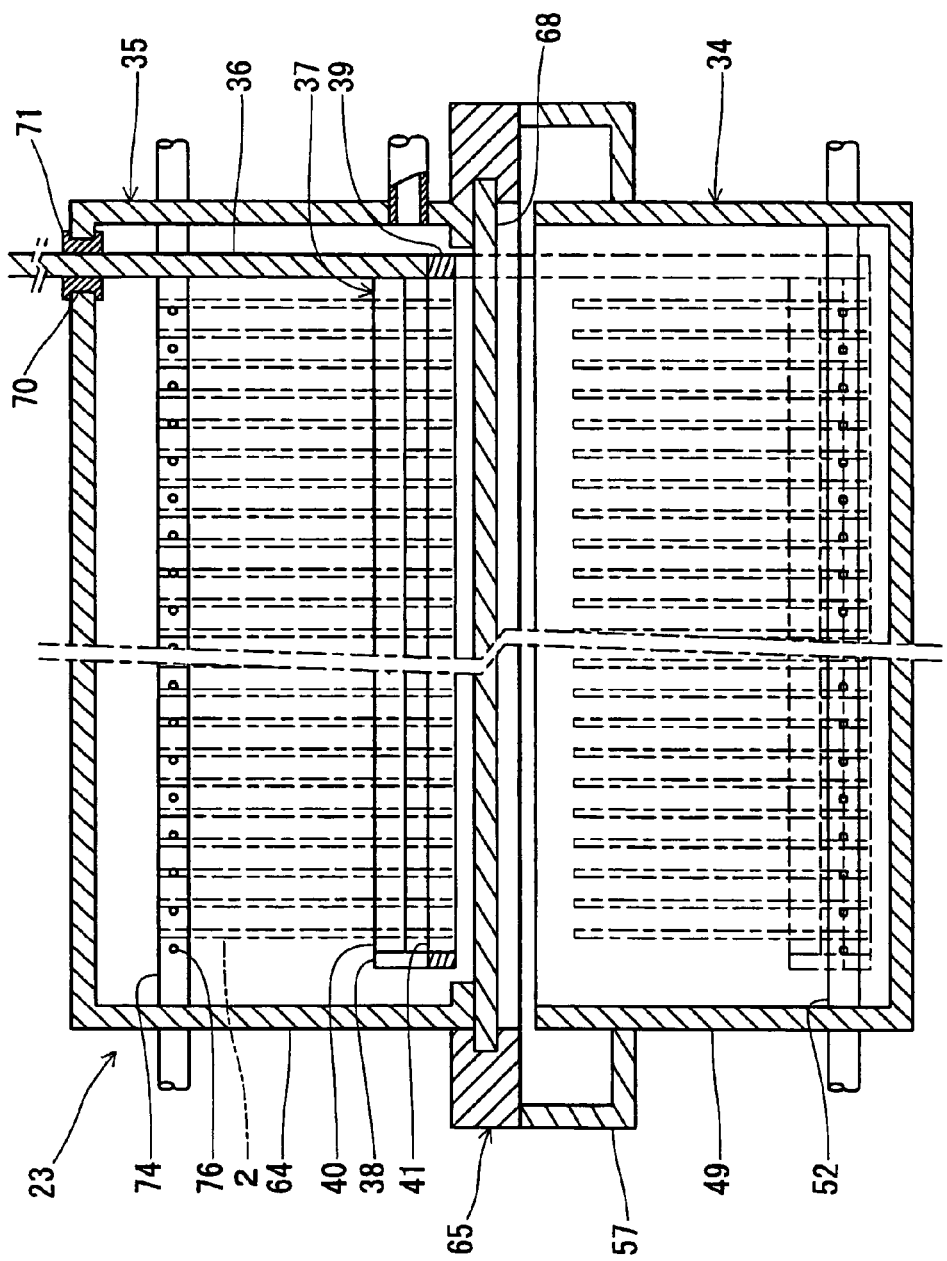
FIG. 4 is a sectional view taken on the line VI-VI in FIG. 3.

As shown in the FIGS. 2 to 4, the substrate cleaning and drying unit 23 includes a cleaning apparatus 34 for cleaning a batch 5 of wafers 2, and a drying apparatus 35 for drying a batch 5 of wafers 5. The drying apparatus 35 is disposed above the cleaning apparatus 34. The cleaning apparatus 34 and the drying apparatus 35 are combined integrally.

The substrate cleaning and drying unit 23 has a guide bar 36 connected to the wafer lifting mechanism 22, and a wafer boat 37 connected to the lower end of the guide bar 36. The wafer boat 37 supports whole wafers 2 contained in one batch 5. The wafer boat 37 includes connecting members 38 and 39 (FIG. 4), and four support members 40, 41, 42 hand 43 (FIG. 3) extended between the connecting members 38 and 39. As shown in FIG. 3, the four connecting members 40 to 43 are arranged at intervals with respect to a transverse direction, as viewed in FIG. 3, and are attached to the connecting members 38 and 39. Support grooves 44, 45, 46 and 47 are formed at intervals in a longitudinal arrangement (in a transverse arrangement as viewed in FIG. 4) in the upper surfaces of the support members 40 to 43, respectively. Edges of wafers 2 are engaged in the support grooves 44 to 47 so as to support the wafers 2 on the support members 40 to 43. The wafer lifting mechanism 22 moves the guide bar 53 vertically to move the wafer boat 37 between the cleaning apparatus 34 and the drying apparatus 35. Thus a batch 5 of wafers 2 supported on the wafer boat 37 is moved vertically between the cleaning apparatus 34 and the drying apparatus 35 with the movement of the wafer boat 37. The wafer lifting mechanism 22 is connected to a control device 48. This control device 48 is adapted to drives and controls the wafer lifting mechanism 22.

The cleaning apparatus 34 is provided with a cleaning tank 49 having the shape of a bottomed rectangular box having an open upper end and capable of containing wafers 2. As shown in FIG. 3, the cleaning tank 49 has right and left side walls 50 and 51, and cleaning liquid spouting nozzles 52 and 53 attached to the side walls 50 and 51, respectively. The cleaning tank 49 has a bottom wall 54. A drain pipe 55 is connected to the bottom wall 54 so as to open into the cleaning tank 49. A shutoff valve 56 is placed in the drain pipe 55. The upper end of the cleaning tank 49 is surrounded by an overflow tank 57. The overflow tank 57 has a bottom wall 58. A drain pipe 59 is connected to the bottom wall 58 of the overflow tank 57 so as to open into the overflow tank 57. A shutoff valve 60 is placed in the drain pipe 59.

As shown in FIG. 2, the cleaning liquid spouting nozzles 52 and 53 are connected to a three-way valve 63 connected to a pure water source 61 for supplying pure water and a chemical solution source 62 for supplying a chemical solution. The three-way valve 63 is controlled so as to spout pure water or the chemical solution selectively through the cleaning liquid spouting nozzles 52 and 53 into the cleaning tank 49. The shutoff valves 56 and 60 and the three-way valve 63 are connected to the control device 48. The control device 48 controls the shutoff valves 56 and 60 to open and close the same, and controls the three-way valve 63 to connect the pure water source 61 or the chemical solution source 62 selectively to the cleaning liquid pouring nozzles 52 and 53.

As shown in FIG. 2, the drying apparatus 35 includes: a drying tank 64 substantially resembling a box having an open lower end and capable of accommodating wafers 2; a shutter mechanism 65 for covering the open lower end of the drying tank 64; and a fluid supply mechanism (dry vapor supply mechanism) 78 connected to the drying tank 64 to supply a dry vapor, such as IPA gas (isopropyl alcohol gas) and a carrier gas, such as nitrogen gas, into the drying tank 64. As shown in FIG. 3, the shutter mechanism 65 has a casing 66 forming a shutter holding structure 67 in a left part thereof, and a shutter 68 capable of being received in the shutter holding structure 67. As shown in FIG. 2, a shutter operating mechanism 69 is connected to the shutter 68 of the shutter mechanism 65. The shutter operating mechanism 69 is capable of moving the shutter 68 between the inside and the outside of the shutter holding structure 67 in order to close and to open the open lower end of the drying tank 64. The shutter operating mechanism 69 is connected to the control device 48. The control device 48 controls and drives the shutter operating mechanism 69 to make the shutter operating mechanism 69 drive the shutter mechanism 65.

An upper part of the drying tank 64 has a semicircular cross section conforming to the shape of wafers 2. As shown in FIG. 4, a through hole 70 is formed in a top part of the drying tank 64, and the guide bar 36 is extended through the through hole 70 of the drying tank 64. A sealing member 71 is fitted in the through hole 70 so as to seal the gap between the guide bar 36 and the drying tank 64 in an airtight fashion.

As shown in FIG. 2, the drying tank 64 is connected to a lifting mechanism 72. The lifting mechanism 72 is connected to the control device 48. The control device 48 controls the lifting mechanism 72 to move the drying tank 64 vertically. When the drying tank 64 is lowered to its lower position as shown in FIG. 3, a flange 73 formed on a lower end part of the drying tank 64 comes into close contact with the shutter 68 of the shutter mechanism 65.

As shown in FIGS. 3 and 4, dry vapor spouting nozzles 74 and 75 are attached to right and left part, respectively, of upper parts of the drying tank 64 of the drying apparatus 35. As stated below, the dry vapor spouting nozzles 74 and 75 are connected to the fluid supply mechanism 78. As shown in FIG. 4, spouting pores 76 and 77 are formed in the dry vapor spouting nozzles 74 and 75 at intervals in a longitudinal arrangement (a transverse arrangement as viewed in FIG. 4). The dry vapor and the carrier gas are spouted through the spouting pores 76 and 77.

As shown in FIG. 2, the fluid supply mechanism 78 has: a gas supply pipe 80 connected to the drying tank 64 so as to supply the carrier gas into the drying tank 64; a chemical source 85 for supplying a chemical to be evaporated so as to generate a dry vapor, such as IPA (isopropyl alcohol); a chemical supply pipe 86 having one end connected to a middle part of the gas supply pipe 80 and the other end connected to the chemical source 85, heating mechanisms 83 and 84 placed in parts of the gas supply pipe 80 on the downstream side of the joint of the chemical supply pipe 86 and the gas supply pipe 80 so as to heat a fluid flowing through the gas supply pipe 80; and an intermittent supply mechanism 87 placed in the chemical supply pipe 86 so as to supply the chemical through the chemical supply pipe 86 into the gas supply pipe 80 intermittently. The gas supply pipe 80 includes a separate part 80a in which the gas supply pipe 80 is branched into a plurality of branch pipes, for example, two branch pipes 81 and 82 in this embodiment. An end of the chemical supply pipe 86 is branched into a plurality of branch pipes and the branch pipes of the chemical supply pipe 86 are connected to the branch pipes 81 and 82 of the gas supply pipe 80, respectively. The heating mechanisms 83 and 84 are placed in the branch pipes 81 and 82, respectively.

The intermittent supply mechanism 87 includes: a chemical containing tank 88 containing the chemical and placed in the chemical supply pipe 86; a pressurizing gas source 89 for supplying a pressurizing gas, such as nitrogen gas; a straightening device 90 placed in a part of the chemical supply pipe 86 on the downstream side of the chemical containing tank 88; and a shutoff valve 91. The pressurizing gas source 89 is connected to an upper part of the chemical containing tank 88. The chemical supply pipe 86 is connected to lower parts of the chemical containing tank 88 from both the upstream side and the downstream side. The intermittent supply mechanism 87 includes a drain pipe 92 connected to the chemical supply pipe 86 on the downstream side of the chemical containing tank 88, and a shutoff valve 98 placed in the drain pipe 92.

As shown in FIG. 2, the fluid supply mechanism 78 also includes a preheating mechanism 94. The preheating mechanism 94 is placed in a part of the gas supply pipe 80 on the upstream side of the joint of the gas supply pipe 80 and the chemical supply pipe 86 so as to heat the carrier gas flowing through the gas supply pipe 80. The fluid supply mechanism 78 has a filter 96 and heating mechanism 97. The filter 96 and the heating mechanism 97 are placed in a part of the gas supply pipe 80 on the downstream side of the separate part 80a. The heating mechanism 97 is configured to heat a fluid flowing through the filter 96.

The heating mechanisms 83, 84 and 97, the preheating mechanism 94 and the shutoff valves 91, 93 and 95 of the fluid supply mechanism 78 are connected to the control device 48. The control device 48 controls the heating operation of the heating mechanisms 83, 84 and 97 and the preheating mechanism 94 and the flow regulating operation of the shutoff valves 91, 93 and 95.

In a carrier gas supply step, in which the carrier gas is supplied while the drying gas is stopped to be supplied, the control device 48 closes the shutoff valves 91 and 93 of the intermittent supply mechanism 87, opens the shutoff valve 95 and makes the heating mechanisms 83, 84 and 97 and the preheating mechanism 94 function. Consequently, the fluid supply mechanism 78 supplies only the carrier gas heated at a predetermined temperature from the carrier gas source 79 through the spouting pores 76 and 77 into the drying tank 64.

In a mixed fluid supply step, in which both the dry vapor and the carrier gas are supplied simultaneously, the control device 48 opens the shutoff valves 91 and 95, closes the shutoff valve 93 and makes the heating mechanisms 83, 84 and 97 and the preheating mechanism 94 function. Consequently, the chemical is forced to flow into the branch pipes 81 and 82 of the gas supply pipe 80 by the pressuring gas supplied from the pressuring gas source 89. The chemical is diffused in a misty fashion in the branch pipes 81 and 82 by the carrier gas. The heating mechanisms 83 and 84 heat the mist of the chemical so as to generate a dry vapor. The dry vapor is additionally heated by the heating mechanism 97. Thus the dry vapor heated at a predetermined temperature and the carrier gas are spouted through the spouting pores 76 and 77 into the drying tank 64.

That is to say, by operating the shutoff valve 91, controlled by the control device 48, of the intermittent supply mechanism 87 so as to open the chemical supply pipe 86, the chemical is intermittently mixed into the carrier gas. A mixed fluid containing the dry vapor generated by heating the chemical, and the carrier gas is spouted through the spouting pores 76 and 77.

As stated above, in this drying apparatus 35, the spouting pores 76 and 77 open into the drying tank 64, and the fluid supply mechanism 78 for supplying the dry vapor for drying the wafers 2 together with the carrier gas is connected to the spouting pores 76 and 77. The fluid supply mechanism 78 spouts the mixed fluid containing the carrier gas and the dry vapor intermittently through the spouting pores 76 and 77. Thus the dry vapor is spouted intermittently into the drying tank 64. The dry vapor intermittently spouted into the drying tank 64 touches the wafers 2 so as to dry the wafers 2. The intermittent contact of the dry vapor with the wafers 2 can prevent the condensation of the dry vapor on the surfaces of the wafers 2 and can prevent the contamination of the surfaces of the wafers 2 resulting from the condensation of the dry vapor.

In some cases, contaminants adhere particularly to upper peripheral areas (unusable peripheral areas) of the wafers 2 when the wafers 2 are carried. If the dry vapor condensates on the upper peripheral areas of the wafers 2, the contaminants are carried by the condensate of the dry vapor into the usable inner areas of the wafers 2. This embodiment can prevent troubles resulting from the condensation of the dry vapor on the surfaces of the wafers 2 by preventing the dry vapor from condensing on the surfaces of the wafers 2.

In the drying apparatus 35, the dry vapor intermittently is mixed into the continuously supplied carrier gas so as to spout the mixture of the dry vapor and the carrier gas intermittently through the spouting pores 76 and 77. That is to say, the carrier gas is supplied always continuously into the drying tank 64 and hence the flow of the gas in the drying tank 64 can be stabilized. Particles on the wafers 2 are thus prevented from being flung up and from adhering again to the wafers 2.

In addition, in the drying apparatus 35, the carrier gas source 79 is connected to the spouting pores 76 and 77 by the gas supply pipe 80. Middle parts of the gas supply pipe 80 are provided with the heating mechanisms 83 and 84 for vaporizing the chemical so as to generate the dry vapor. The chemical supply pipe 86 connected to the chemical source 85 is connected to a middle part of the gas supply pipe 80 on the upstream side of the heating mechanisms 83 and 84. Furthermore, the chemical supply pipe 86 is provided with the intermittent supply mechanism 87 for intermittently supplying the chemical. Owing to these arrangement, the chemical thus intermittently supplied into the gas supply pipe 80 is diffused in the mist fashion in the gas supply pipe 80 and the mist of the chemical is mixed with the carrier gas. The mixture of the carrier gas and the mist of the chemical is heated by the heating mechanisms 83 and 84. Consequently, the chemical for producing the dry vapor can be satisfactorily gasified.

Furthermore, in the drying apparatus 35, the preheating mechanism 94 is placed in the part of the gas supply pipe 80 on the upstream side of the joint of the gas supply pipe 80 and the chemical supply pipe 86 so as to preheat the carrier gas flowing through the gas supply pipe 80. The mist of the chemical can be preheated by the carrier gas preheated by the preheating mechanism 94 before the mist of the chemical is heated by the heating mechanisms 83 and 84. Consequently, the chemical for producing the dry vapor can be further satisfactorily gasified.

Furthermore, in the drying apparatus 35, the branch pipes 82 and 82 branch out from the gas supply pipe 80 in the separate part 80a. The chemical supply pipe 86 is connected to the branch pipes 81 and 82. The heating mechanisms 83 and 84 are on the downstream side of the joints of the chemical supply pipe 86 and the branch pipes 81 and 82, respectively. Therefore, the amount of the chemical to be gasified by each of the heating mechanisms 83 and 84 can be reduced. Consequently, the chemical for producing the dry vapor can be further satisfactorily gasified.

The operations of the components of the substrate cleaning and drying unit 23 thus constructed are controlled by the control device 48. The control device 48 can control not only the operations of the substrate cleaning and drying unit 23, but also those of the components of the substrate processing system 1. The control device 48 has a controller 98 including a CPU, and a storage medium (a recording medium) 99 connected to the controller 98. A cleaning program 100 and a drying program 101 and set data are stored in the storage medium 99. The storage medium may be any one of known storage devices, for example a memory, such as a ROM or a RAM, a hard disk, or a disk-shaped storage medium, such as or a CD-ROM.

A wafer processing method of processing wafers 2 using the above substrate cleaning and drying unit 23 including the cleaning apparatus 34 and the drying apparatus 35 will be described by way of example.

The control device 48 drives the components of the substrate cleaning and drying unit 23 according to a substrate processing program including the cleaning program 100 and the drying program 101 stored in the storage medium 99. The substrate cleaning and drying unit 23 thus controlled carries out the cleaning process for cleaning wafers 2 and the drying process for drying wafers 2 successively.

Figure 5:
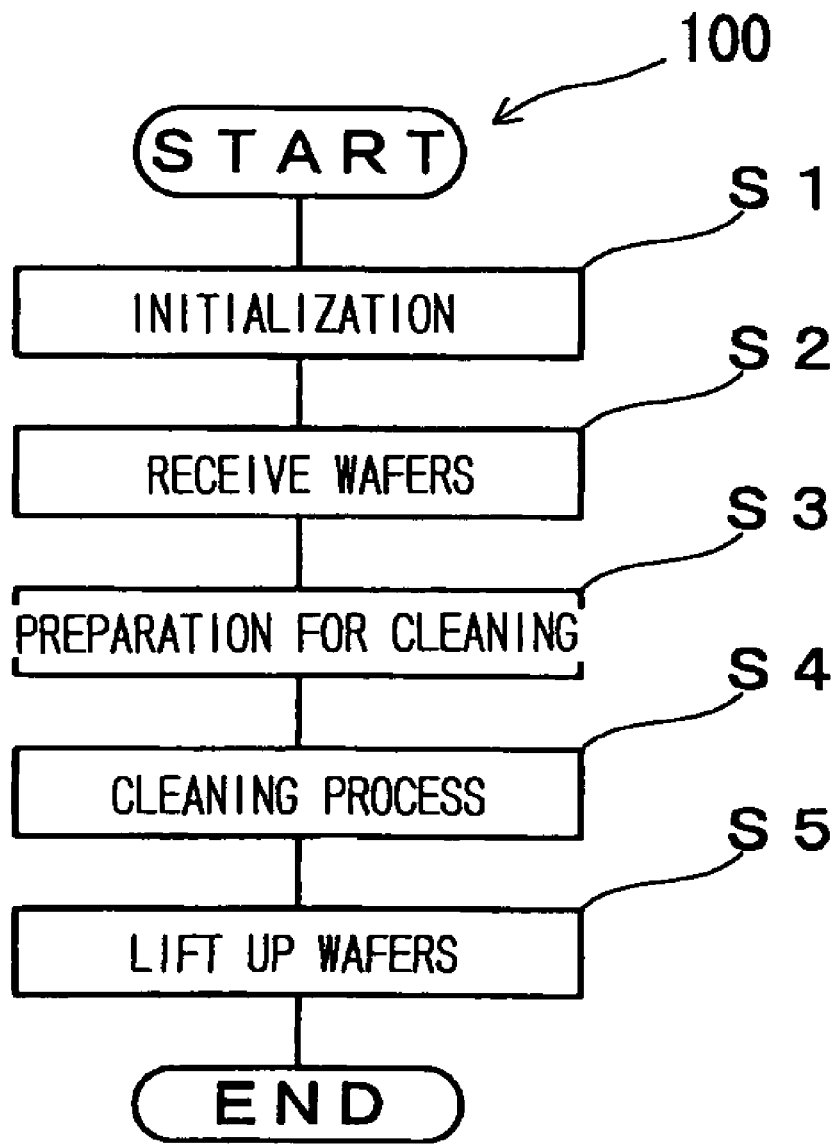
FIG. 5 is a flow chart for explaining a cleaning method and a cleaning program to be carried out by the substrate cleaning and drying unit shown in FIG. 2.
Figure 6:
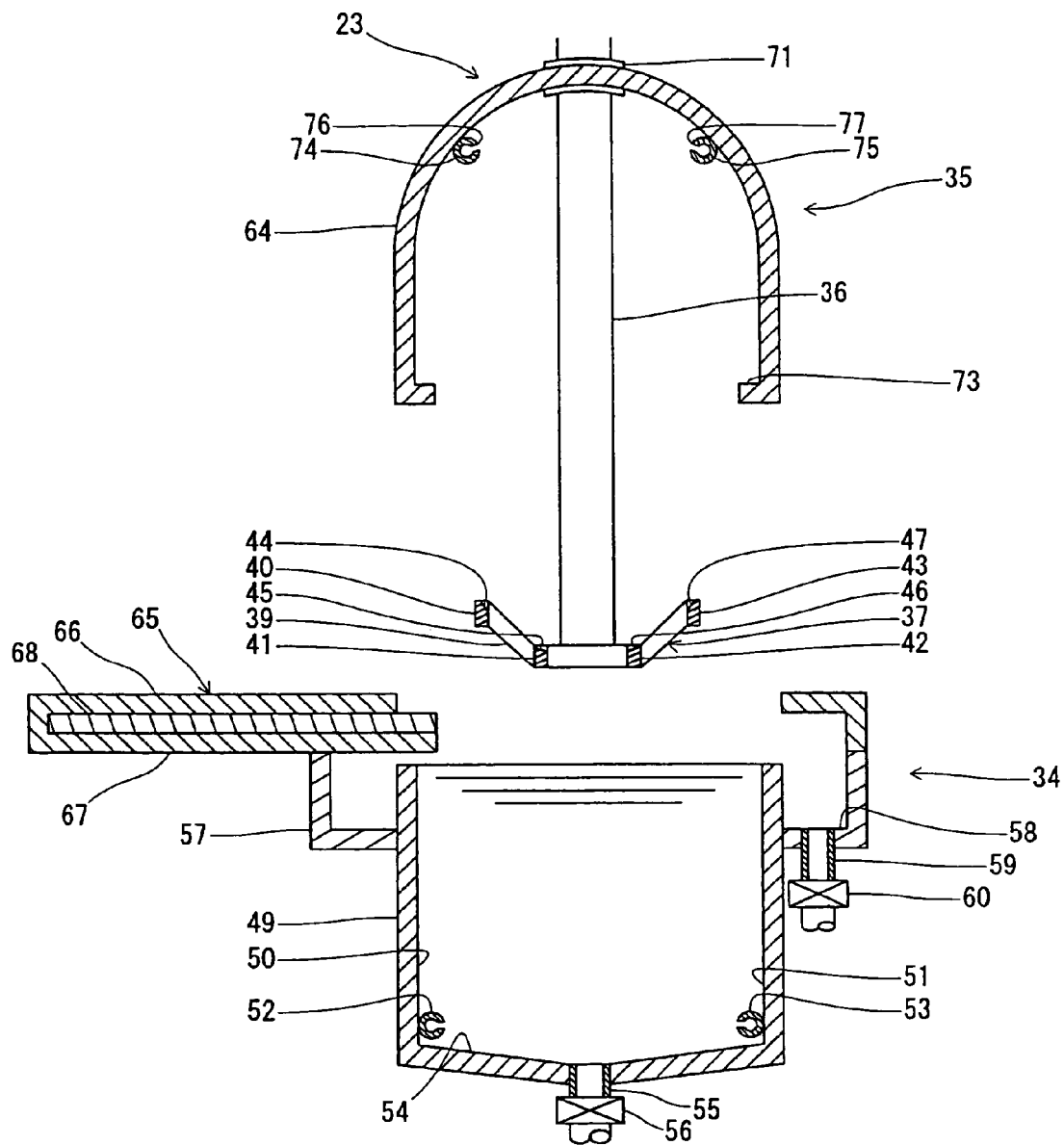
FIG. 6 is a sectional view for explaining cleaning operations of the substrate cleaning and drying unit at an initializing stage.

As shown in FIG. 5, the cleaning program 100 gives a direction to initialize the substrate cleaning and drying unit 23 in an initialization step S1. More concretely, the control device 48 sets the components of the substrate cleaning and drying unit 23 as follows. As shown in FIG. 6, the shutoff valve 56 of the cleaning tank 49 and the shutoff valve 60 of the overflow tank 57 are closed. The shutter 68 is retracted into the shutter holding structure 67 by the shutter operating mechanism 69 so as to open the upper end of the cleaning tank 49. The wafer lifting mechanism 22 lifts up the wafer boat 37 to a position above the shutter mechanism 65 at a distance from the shutter mechanism 65. The lifting mechanism 72 lifts up the drying tank 64 to a position at a distance from the wafer boat 37. Then, the control device 48 operates the three-way valve 63 so as to supply pure water from the pure water source 61 through the cleaning liquid spouting nozzles 52 and 53 into the cleaning tank 49. The control device 48 gives a signal to open the shutoff valve 60 of the overflow tank 57 so that pure water overflowed from the cleaning tank 49 is drained from the overflow tank 57.

Then, the cleaning program 100 provides a direction to load the wafer boat 37 with a batch 5 of a plurality of wafers 2, for example, fifty wafers 2 in a wafer receiving step S2. More concretely, a batch carrying mechanism 17 carries a batch 5 formed of a plurality of wafers 2 in response to a signal given thereto by the control device 48, and then the batch 5 formed of the wafers 2 is put on the support members 40 to 43 as shown in FIG. 7. The wafers 2 of the batch 2 are engaged in the support grooves 44 to 47 formed in the support members 40 to 43.

Figure 8:
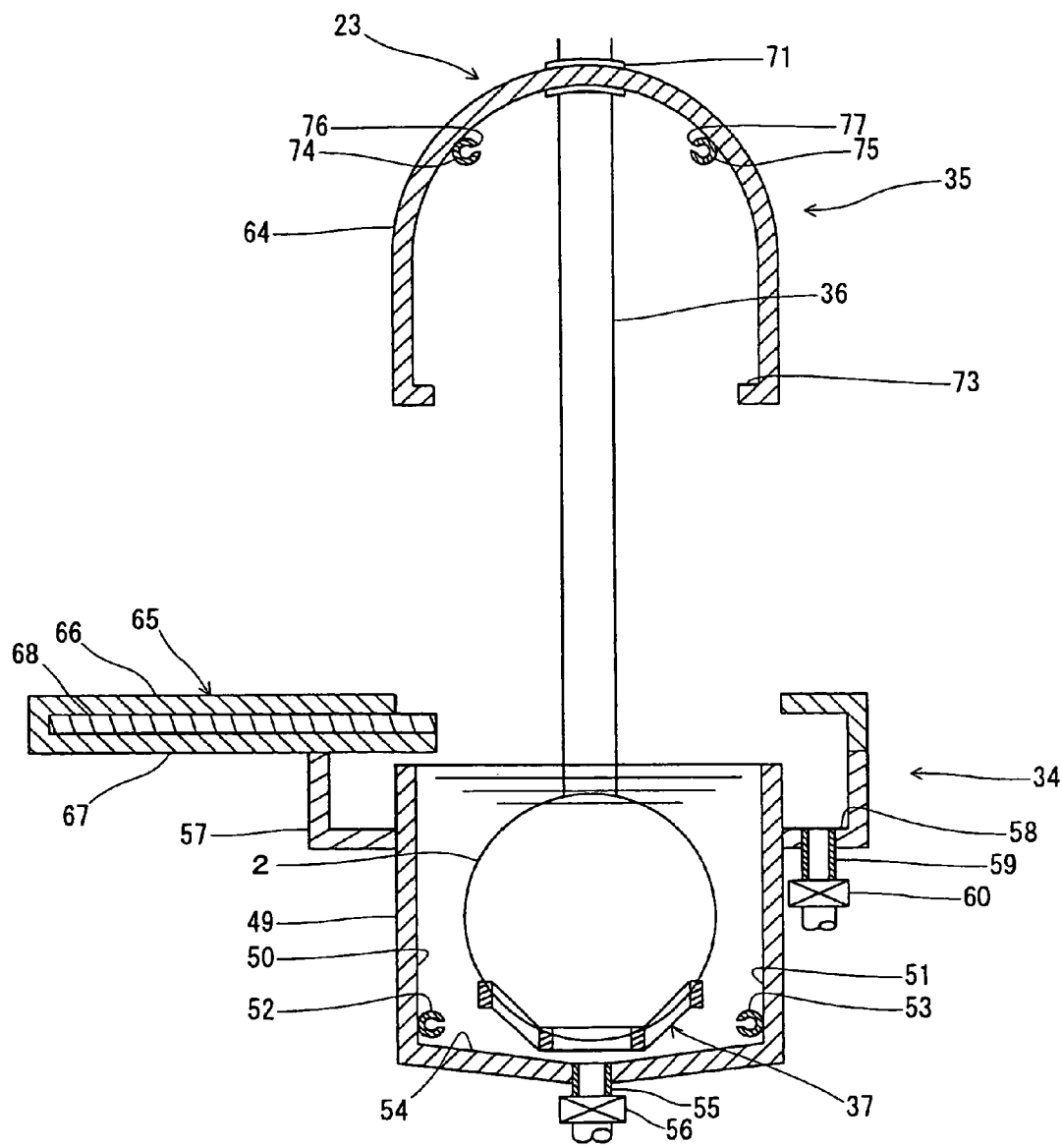
FIG. 8 is a sectional view for explaining cleaning operations of the substrate cleaning and drying unit at a cleaning condition preparing stage.

Subsequently, the cleaning program 100 gives a direction to prepare for cleaning by immersing the wafers 2 supported on the wafer boat 37 in the pure water contained in the cleaning tank 49 in a preparatory cleaning step 53. More concretely, the wafer lifting mechanism 22 lowers the wafer boat 37 into the cleaning tank 49 in response to a control signal given thereto as shown in FIG. 8. Thus the wafers 2 supported on the wafer boat 37 are immersed in the pure water contained in the cleaning tank 49.

Then, the cleaning program 100 gives a direction to clean the wafer 2 in the cleaning tank 49 by a cleaning process in a cleaning step S4. The components are operated as follows to clean the wafers 2 in response to a signal given thereto by the control device 48.

The shutoff valve 56 of the cleaning tank 49 is kept closed and the shutoff valve 60 of the overflow tank 57 is opened. The three-way valve 63 is operated so as to supply chemical solution (cleaning liquid) from chemical solution source 62 through the cleaning liquid pouring nozzles 52 and 53 of the cleaning tank 49 into the cleaning tank 49. Consequently, the pure water (the cleaning liquid) overflows from the cleaning tank 49 gradually into the overflow tank 57 and the cleaning tank 49 is filled up with the chemical solution. The wafers 2 immersed in the chemical solution contained in the cleaning tank 49 are cleaned by the chemical solution.

Then, the shutoff valve 56 of the cleaning tank 49 is kept closed and the shutoff valve 60 of the overflow tank 57 is kept opened. The three-way valve 63 is operated so as to supply pure water (cleaning liquid) from the pure water source 61 through the cleaning liquid pouring nozzles 52 and 53 of the cleaning tank 49 into the cleaning tank 49. Consequently, the chemical solution (the cleaning liquid) overflows from the cleaning tank 49 gradually into the overflow tank 57 and the cleaning tank 49 is filled up with the pure water. The wafers 2 immersed in the pure water contained in the cleaning tank 49 are cleaned (rinsed) by the pure water.

Ultrasonic waves may be applied (radiated) to a liquid contained in a processing tank by an ultrasonic oscillating means during a chemical cleaning process or a rinsing process in order to remove contaminants from the wafers 2 by the energy of the ultrasonic waves.

Figure 9:
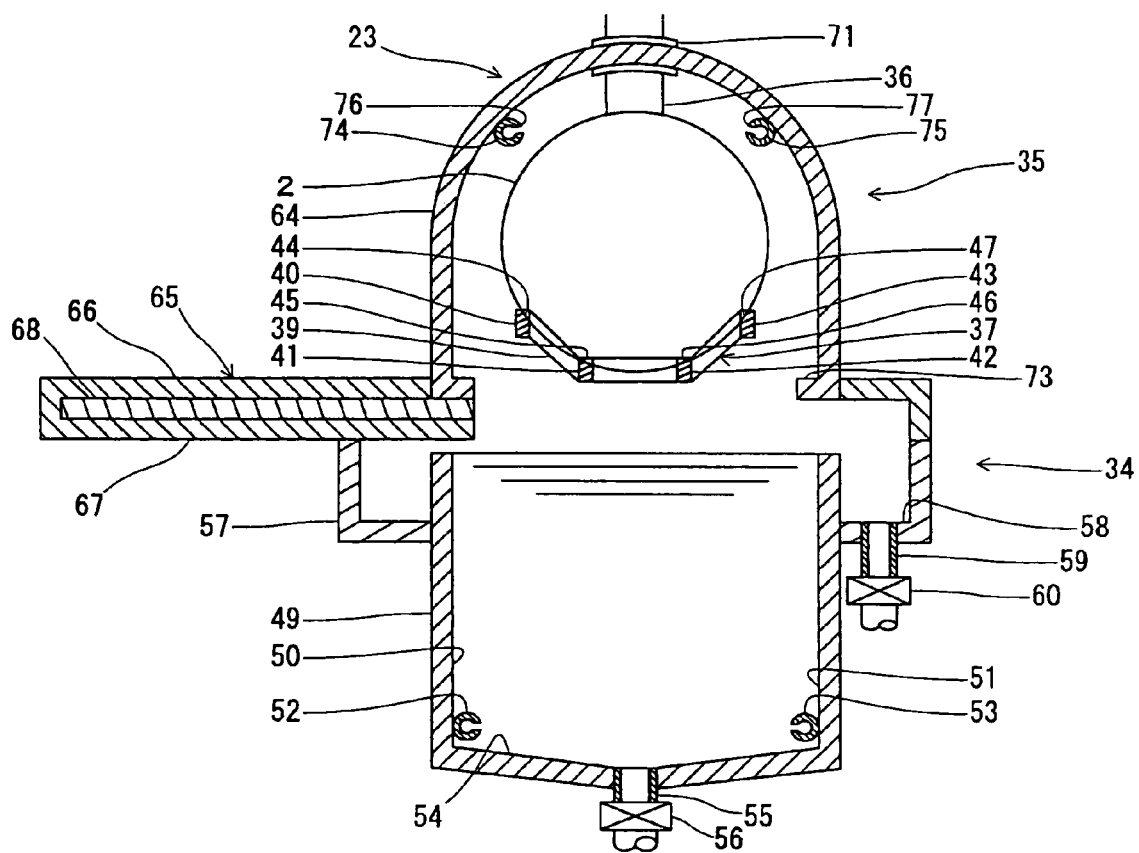
FIG. 9 is a sectional view for explaining cleaning operations of the substrate cleaning and drying unit at a wafer raising stage.

The cleaning program 100 gives a direction to lift up the wafer boat 37 supporting the wafers 2 from the cleaning tank 49 into the drying tank 64 in a wafer lifting step S5. More concretely, as shown in FIG. 9, the lifting mechanism 72 brings the drying tank 64 down to a position right above the shutter mechanism 65 in response to a control signal given thereto by the control device 48. Then, the lifting mechanism 22 lifts up the wafer boat 37 from the cleaning tank 49 into the drying tank 64 in response to a control signal given thereto by the control device 48. Thus the wafer boat 37 supporting the wafers 2 is carried into the drying tank 64.

The cleaning program 100 is ended after thus transferring the wafers 2 from the cleaning tank 49 to the drying tank 64, and then the drying process specified by the drying program 101 is started.

Figure 10:
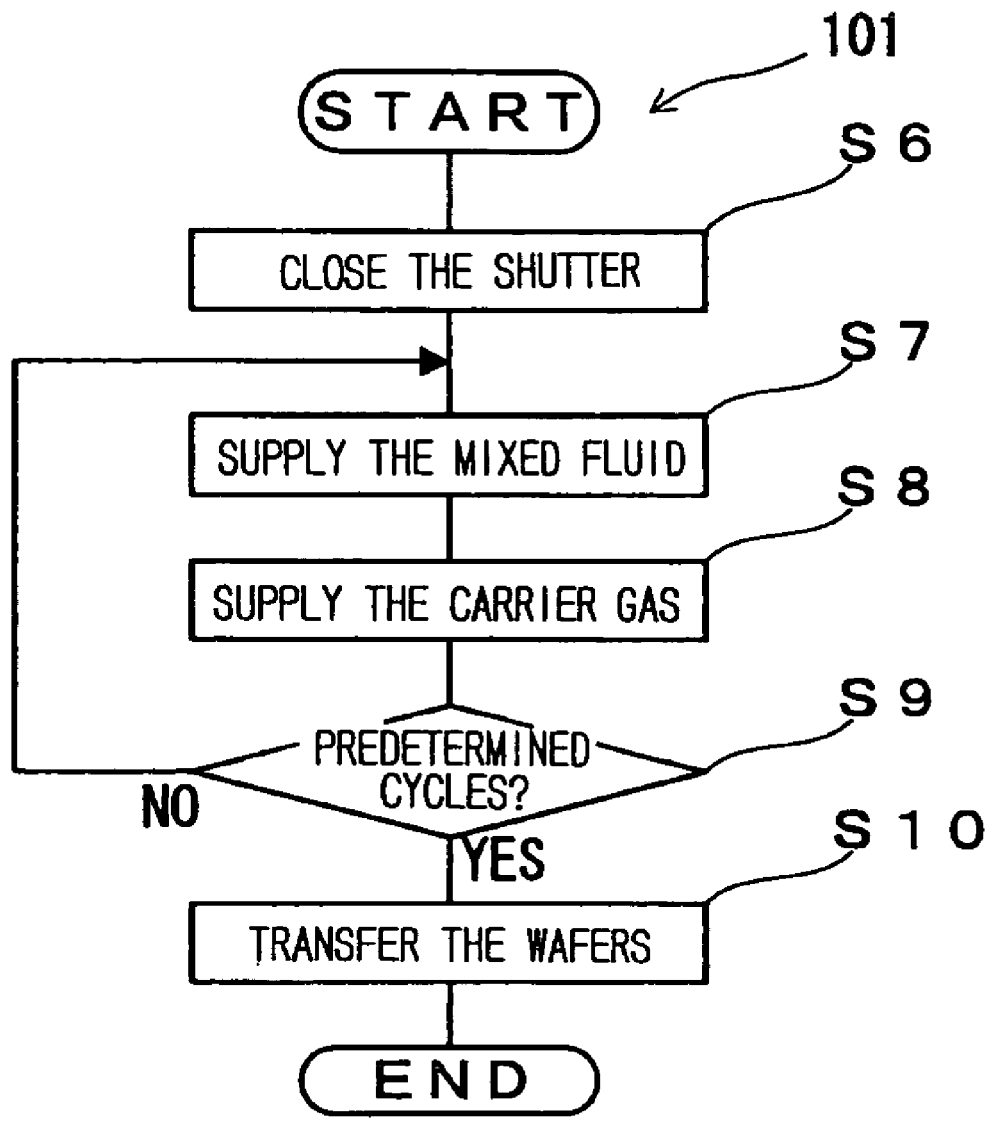
FIG. 10 is a flow chart for explaining a drying method in a preferred embodiment according to the present invention.
Figure 11:
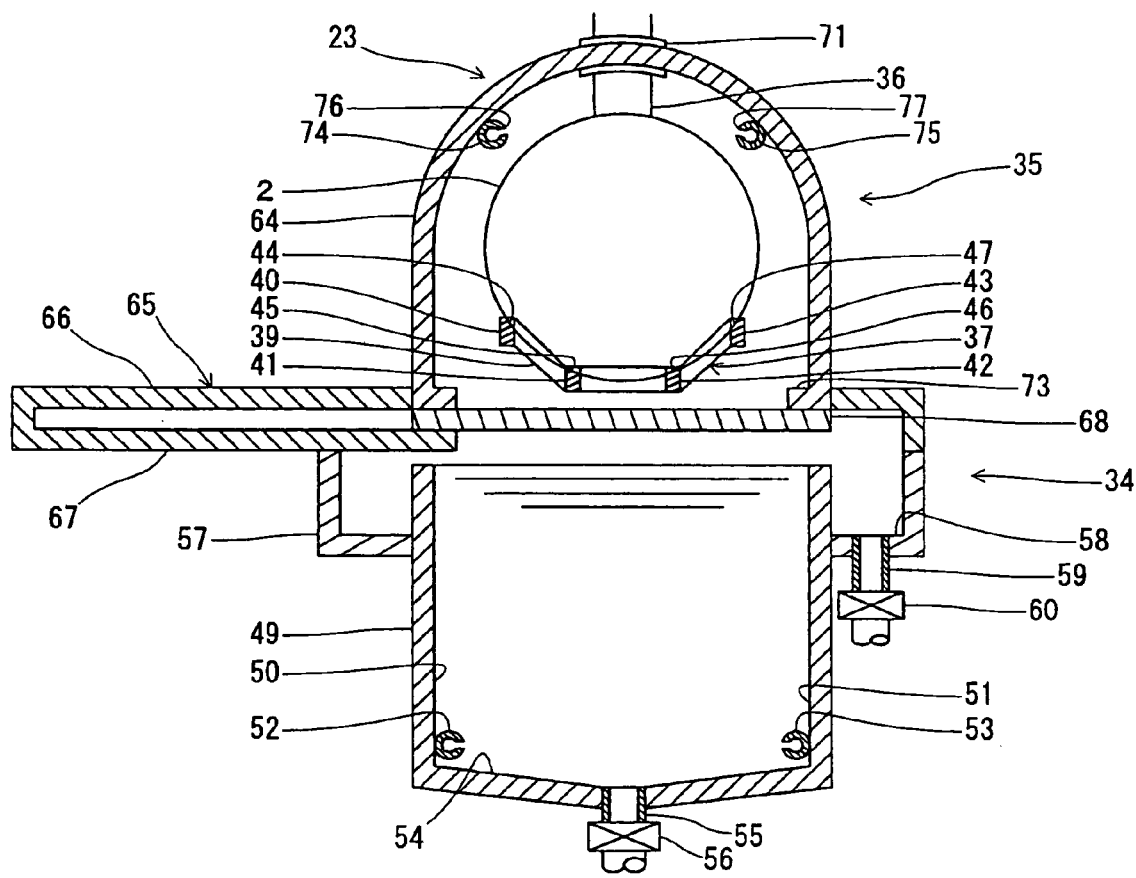
FIG. 11 is a sectional view for explaining drying operations of the substrate cleaning and drying unit at a drying stage.

As shown in FIG. 10, the drying program 101 gives a direction to close the open lower end of the drying tank 64 by the shutter 68 of the shutter mechanism 65 in a shutter closing step S6. More concretely, as shown in FIG. 11, the shutter operating mechanism 69 advances the shutter 68 outward from the shutter holding structure 67 in response to a control signal give thereto by the control device 48. The shutter 68 is brought into close contact with the open lower end of the drying tank 64. Thus the open lower end of the drying tank 64 is closed by the shutter 68.

Subsequently, the mixed fluid containing the dry vapor and the carrier gas is supplied for a predetermined time into the drying tank in a mixed fluid supply step S7 according to the drying program 101. More concretely, the components are operated as follows in response to signals given thereto by the control device 48. The shutoff valves 91 and 95 of the fluid supply mechanism 78 are opened and the shutoff valve 93 is closed. The heating mechanisms 83, 84 and 97 and the preheating mechanism 94 heat the fluid flowing through the gas supply pipe 80. The chemical is forced to flow into the chemical supply pipe 86 by the pressure of the pressurizing gas. The chemical delivered into the chemical supply pipe 86 flows into the branch pipes 81 and 82 of the gas supply pipe 80. The chemical is diffused in mist in the branch pipes 81 and 82 by the carrier gas and the mist of the chemical is mixed into the carrier gas. The chemical is heated by the heating mechanisms 83 and 84 so as to evaporate the chemical and convert the same into the dry vapor. In addition, the dry vapor is heated by the heating mechanism 97. The mixed fluid, which contains the gasified dry vapor and the carrier gas and is heated at a predetermined temperature, is spouted through the spouting pores 76 and 77 into the drying tank 64.

Then, only the carrier gas is supplied into the drying tank 64 for a predetermined time specified by the drying program 101 in a carrier gas supply step S8. More concretely, the shutoff valves 91 and 93 of the intermittent supply mechanism 87 are closed and the shutoff valve 95 is opened in response to a control signal provided by the control device 48. The heating mechanisms 83, 84 and 97 and the preheating mechanism 94 heat the fluid flowing through the gas supply pipe 80. Thus only the carrier gas, which is supplied by the carrier gas source 79 and is heated at a predetermined temperature, is spouted through the spouting pores 76 and 77 into the drying tank 64.

Figure 12:
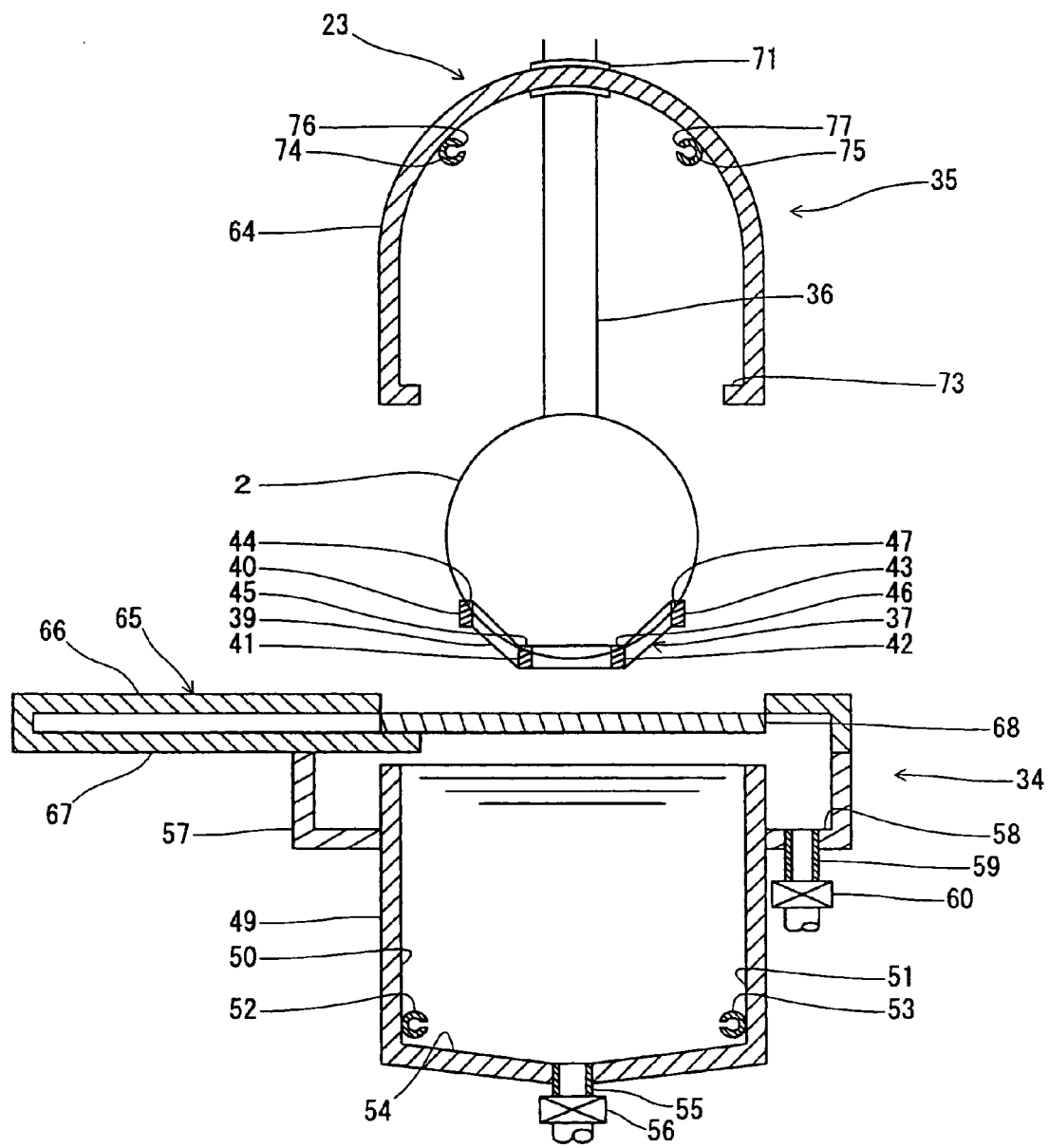
FIG. 12 is a sectional view for explaining drying operations of the substrate cleaning and drying unit at a wafer delivery stage.

Then, the drying program 101 makes a query in step S9 to see whether or not the mixed fluid supply step S7 and the carrier gas supply step S8 have been repeated by predetermined cycles. If the response to the query made in step S9 is negative, the drying program 101 returns to the mixed fluid supply step S7 as shown in FIG. 10. If the response to the query made in step S9 is affirmative, the wafers 2 processed by the cleaning process and the drying process are transferred to the batch carrying mechanism 17 in a wafer transfer step S10. More concretely, as shown in FIG. 12, the lifting mechanism 72 lifts up the drying tank 64 and the batch carrying mechanism 17 receives the wafers 2 from the wafer boat 37 in response to a control signal given thereto by the control device 48.

Figure 13:
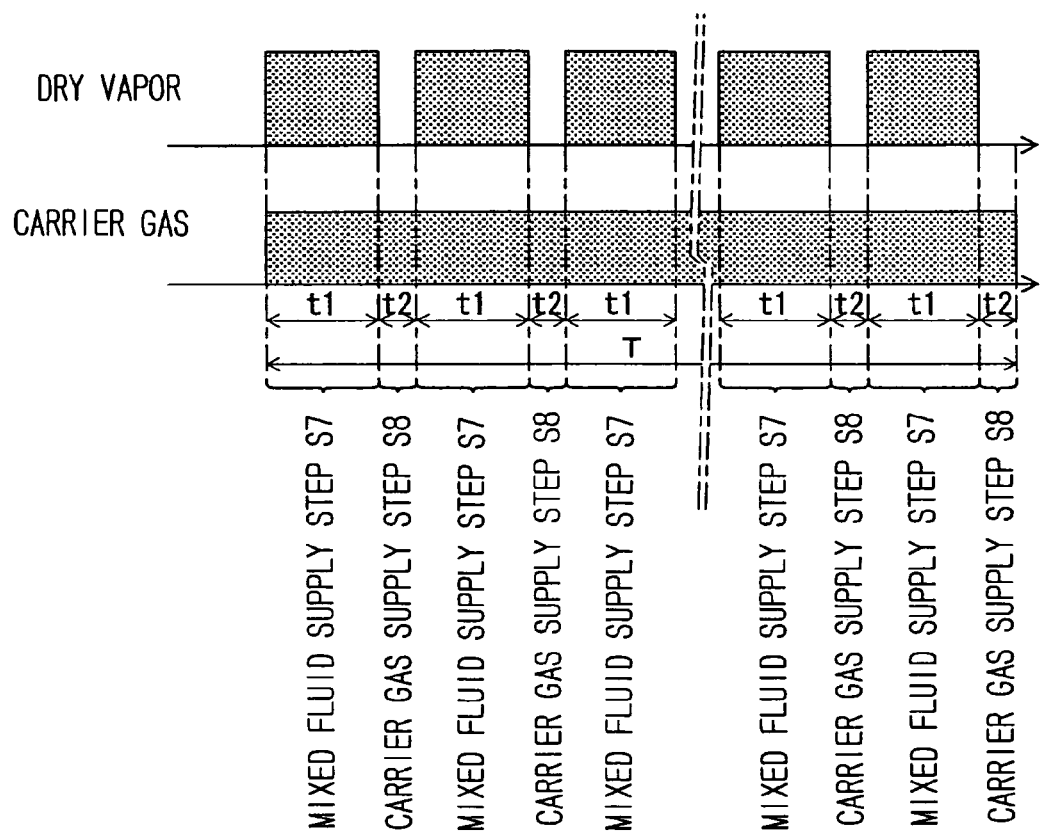
FIG. 13 is a diagram for explaining a drying procedure to be carried out by the drying apparatus.

As typically shown in FIG. 13, the drying program 101 repeats the mixed fluid supply step S7 of supplying both the carrier gas and the dry vapor and the carrier gas supply step S8 of stopping the dry vapor and supplying only the carrier gas successively and alternately with no step in between.

Although the drying program 101 repeats the dry vapor supply step (the mixed fluid supply step S7) and the carrier gas supply step (the carrier gas supply step S8) successively and alternately, only the dry vapor supply step (the mixed fluid supply step S7) may be executed intermittently and the carrier gas supply step (the carrier gas supply step S8) may be omitted.

In the drying process to be carried out according to the drying program 101, the mixed fluid supply step (the mixed fluid supply step S7) of supplying the mixed fluid containing the carrier gas and the dry vapor into the drying tank 64 is executed intermittently after the substrate carrying mechanism 14 has carried the wafers 2 from the cleaning tank 49 into the drying tank 64. Therefore, the dry vapor intermittently supplied into the drying tank 64 touches the wafers 2 so as to dry the wafers 2. Since the dry vapor touches the wafers 2 intermittently, the dry vapor can be prevented from condensing on the surfaces of the wafers 2. Thus the contamination of the surfaces of the wafers 2 resulting from the condensation of the dry vapor on the surfaces of the wafers 2 can be prevented.

In some cases, contaminants adhere particularly to upper peripheral areas (unusable peripheral areas) of the wafers 2 when the wafers 2 are carried. If the dry vapor condensates on the upper peripheral areas of the wafers 2, the contaminants are carried by the condensate of the dry vapor into the usable inner areas of the wafers 2. This embodiment can prevent troubles resulting from the condensation of the dry vapor on the surfaces of the wafers 2 by preventing the dry vapor from condensing on the surfaces of the wafers 2.

The drying process repeats supplying the mixed fluid (the mixed fluid supply step S7) and supplying only the carrier gas into the drying tank 64 (the carrier gas supply step S8) are repeated successively and alternately. Therefore, the flow of the gas in the drying tank 64 can be stabilized. Consequently, particles are thus prevented from being flung up and from adhering again to the wafers 2.

By the way, a mixed fluid supply period (duration t1 of the mixed fluid supply step S7) and a carrier gas supply period (duration t2 of the carrier gas supply step S8) may be properly determined taking the types of the dry vapor and the carrier gas, the quality of the surfaces of the wafers 2 or the like into consideration.

The inventors of the present invention conducted wafer drying experiments in which wafers 2 were dried under different drying conditions. In the drying experiments, a total mixed fluid supply time, which was equal to the sum of the mixed fluid supply periods (the product of the duration t1 of the mixed fluid supply step S7 and the frequency of repetition of the mixed fluid supply step S7), was fixed. On the other hand, the mixed fluid supply period (duration t1 of the mixed fluid supply step S7) and the carrier gas supply period (duration t2 of the carrier gas supply step S8) was changed in order to change the ratio between the mixed fluid supply period (duration t1 of the mixed fluid supply step S7) and the carrier gas supply period (duration t2 of the carrier gas supply step S8) such that the ratio of the total mixed fluid supply time (the product of the duration t1 of the mixed fluid supply step S7 and the frequency of repetition of the mixed fluid supply step S7) relative to a total fluid supply time T, which was equal to the total sum of the sum of the mixed fluid supply periods (the product of the duration t1 of the mixed fluid supply step S7 and the frequency of repetition of the mixed fluid supply step S7) and the sum of the carrier gas supply periods (the product of the duration t2 of the carrier gas supply step S8 and the frequency of repetition of the carrier gas supply step S8) is changed. The numbers of contaminants remaining on the surfaces of the wafers 2 dried under different drying conditions were measured. Measured results are shown in Table 1.

The total mixed fluid supply time (the product of the duration t1 of the mixed fluid supply step S7 and the frequency of repetition of the mixed fluid supply step S7) was 90 s. The dry vapor was supplied at 2.0 ml/s in the mixed fluid supply step S7. The mixed fluid supply periods (duration t1 of the mixed fluid supply step S7) were 2 s, 4 s, 6s, 8 s and 10 s. The carrier gas supply periods (duration t2 of the carrier gas supply step S8) were 2 s, 3s, 6s and 10 s for each of the mixed fluid supply periods. In Table 1, values in parentheses are the ratios each of the total mixed fluid supply time (the product of the duration t1 of the mixed fluid supply step S7 and the frequency of repetition of the mixed fluid supply step S7) relative to the total fluid supply time T. In Table 1, double circles indicate that the number of counted contaminants was below ten and the wafer 2 was very satisfactorily cleaned, a circle indicates that the number of counted contaminants was not less than ten and below thirty and the wafer 2 was cleaned satisfactorily, and crosses indicate that the number of counted contaminants was not less than thirty.

TABLE 1

| | t2 Stopping time (second/cycle) | | | |
|---|---|---|---|---|
| t1 | 2 | 3 | 6 | 10 |
| Supply time (second/cycle) | | | | |
| 2 | x (50%) | x (40%) | x (25%) | x (17%) |
| 4 | ○ (66%) | ○ (57%) | x (40%) | x (29%) |
| 6 | ◎ (75%) | ○ (66%) | x (50%) | x (38%) |
| 8 | ◎ (80%) | ○ (73%) | ○ (57%) | x (44%) |
| 10 | ◎ (83%) | ◎ (77%) | ○ (63%) | x (50%) |

It is known from Table 1 that many contaminants remained on the surfaces of the wafers 2 when the ratio of the sum of the mixed fluid supply periods (the product of the duration t1 of the mixed fluid supply step S7 and the frequency of repetition of the mixed fluid supply step S7) relative to the total fluid supply time T was 50% or below and hence such drying conditions are not suitable for drying the wafers 2. It is inferred that time for which the dry vapor does not touch the surface of the wafer 2 was excessively long and the wafers 2 were not dried satisfactorily in some periods under such conditions.

The number of contaminants remained on the surface of the wafer 2 was small and the wafer 2 was dried satisfactorily when the ratio of the sum of the mixed fluid supply periods (the product of the duration t1 of the mixed fluid supply step S7 and the frequency of repetition of the mixed fluid supply step S7) relative to the total fluid supply time T was 57% or above. That is to say, it is considered that the supply of the mixed fluid such that the ratio of the sum of the mixed fluid supply periods (the product of the duration t1 of the mixed fluid supply step S7 and the frequency of repetition of the mixed fluid supply step S7) relative to the total fluid supply time T is 57% or above is effective in satisfactorily the drying wafers 2. Thus the dry vapor can be sufficiently supplied so as to dry the wafers satisfactorily and unsatisfactory drying due to the insufficiency of the dry vapor can be avoided.

It is known from Table 1 that the number of contaminants remained on the surface of the wafer 2 was still smaller and the wafer 2 was dried still more satisfactorily when the ratio of the sum of the mixed fluid supply periods (the product of the duration t1 of the mixed fluid supply step S7 and the frequency of repetition of the mixed fluid supply step S7) relative to the total fluid supply time T was 75% or above.

Although not shown in Table 1, the dry vapor condensed on the surfaces of the wafers 2 and many contaminants were found on the surfaces of the wafers 2 after drying when the ratio of the sum of the mixed fluid supply periods (the product of the duration t1 of the mixed fluid supply step S7 and the frequency of repetition of the mixed fluid supply step S7) relative to the total fluid supply time T was above 83%, which is similar to the results of drying by the known drying process that supplies the dry vapor continuously such that the ratio of the sum of the mixed fluid supply periods (the product of the duration t1 of the mixed fluid supply step S7 and the frequency of repetition of the mixed fluid supply step S7) relative to the total fluid supply time T is 100%. On the other hand, the condensation of the dry vapor on the surface of the wafers 2 could be still more effectively prevented when the ratio was 83% or below and the contamination of the wafers 2 resulting from the condensation of the dry vapor could be prevented.

Figure 14:
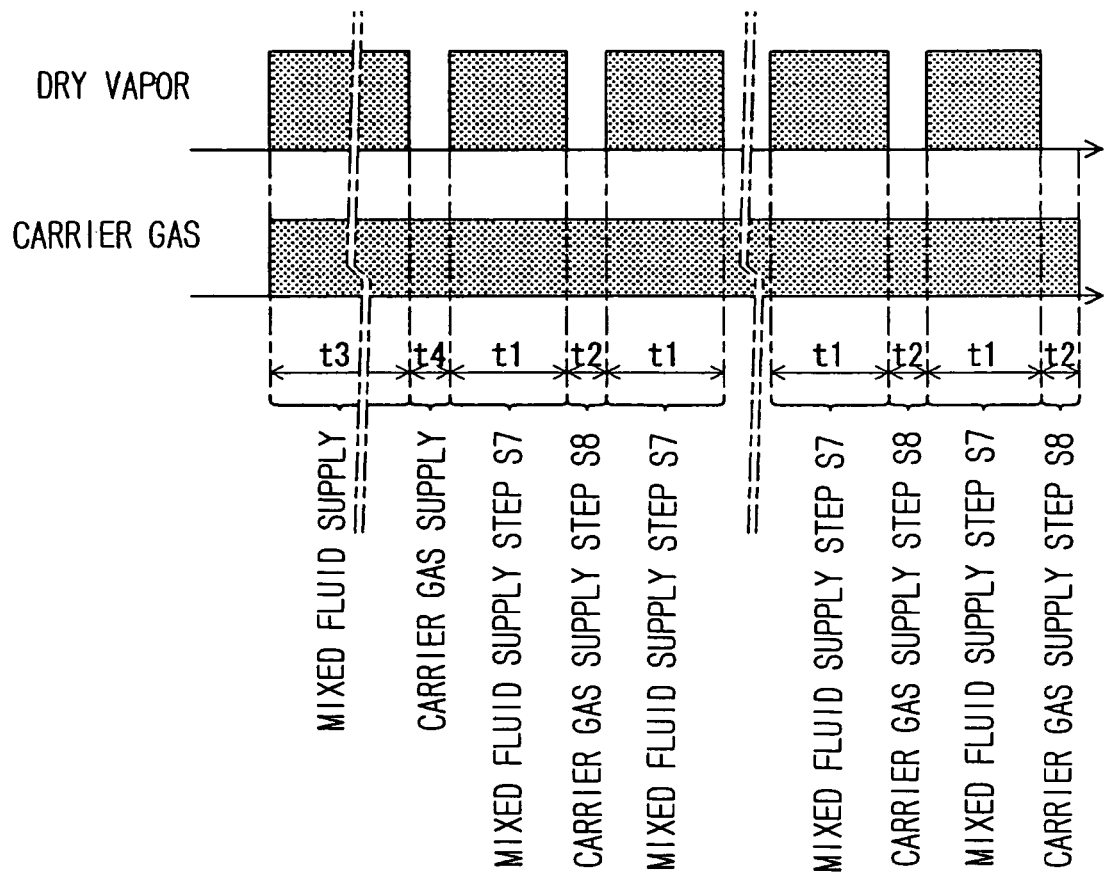
FIG. 14 is a diagram for explaining other drying procedure to be carried out by the drying apparatus.

In the above drying process specified by the drying program 101, the period of one mixed fluid supply cycle (the duration t1 of the mixed fluid supply step S7) for processing one batch 5 is fixed and the period of one carrier gas supply cycle (the duration t2 of the carrying gas supply step S8) for processing one batch 5 is fixed. However, the durations to and t2 do not necessarily need to be fixed. For example, the mixed fluid may be supplied for a fixed time t3 of, for example 20 s in a first period subsequent to the start of the drying process, only the carrier gas may be supplied (the carrier gas supply step S8) for a fixed time t4 of, for example 2 s in a second period subsequent to the first period, and the mixed fluid may be supplied for a fixed time t1 (mixed fluid supply step S7) in a third period subsequent to the second period as shown in FIG. 14.

The surface of the wafer 2 is wetted with a comparatively large amount of the processing liquid, such as cleaning water, immediately after the start of the drying process. Therefore, it is preferable to supply the mixed fluid continuously at the initial stage of the drying process because a large amount of the dry vapor is needed at the initial stage of the drying process. The amount of the dry vapor necessary for drying the wafer is small after the cleaning water wetting the surface of the wafer has decreased. Therefore the condensation of the dry vapor on the surface of the wafer 2 can be prevented and the wafer 2 can be satisfactorily dried by alternately repeating the supply of the mixed fluid and the supply of only the carrier gas.

Figure 15:
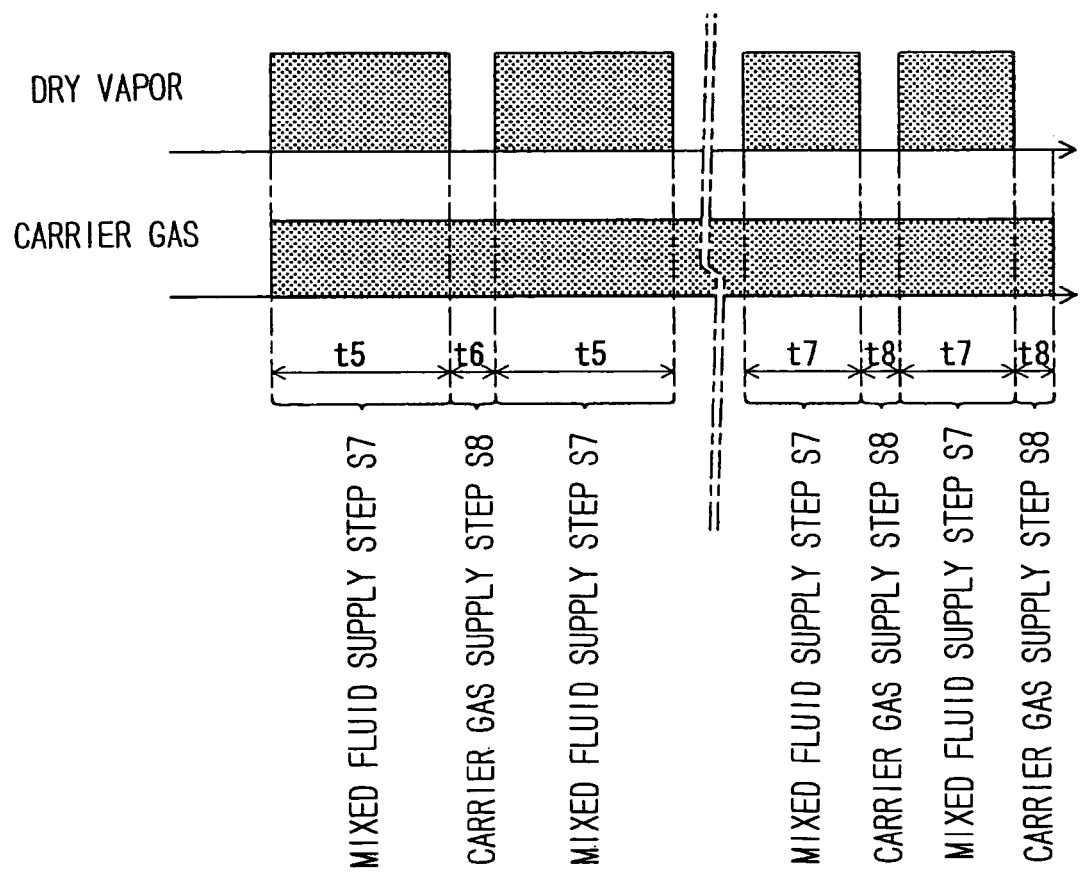
FIG. 15 is a diagram for explaining a yet other drying procedure to be carried out by the drying apparatus.

As shown typically in FIG. 15, the mixed fluid supply period and the carrier gas supply period at the initial stage of the drying process may be different respectively from those at a stage at a predetermined time of, for example, 30 s from the start of the drying process. For example, a mixed fluid supply period (the mixed fluid supply step S7) may be t5 of, for example, 6 s and a carrier gas supply period (the carrier gas supply step S8) may be t6 of, for example 2 s at the initial stage of the drying process, and a mixed fluid supply period (the mixed fluid supply step S7) may be t7 of, for example, 4 s and a carrier gas supply period (the carrier gas supply step S8) may be t8 of, for example 3 s at a stage at a predetermined time of, for example, 30 s from the start of the drying process as shown in FIG. 15. That is to say, the mixed fluid supply period for one mixed fluid supply cycle may be changed after the passage of a predetermined time after the start of the drying process. The carrier gas supply period for one carrier gas supply cycle also may be changed after the passage of a predetermined time after the start of the drying process.

The surface of the wafer 2 is wetted with a comparatively large amount of the cleaning water before a predetermined time elapses after the start of the drying process. Therefore, it is preferable to supply the mixed fluid for a comparatively long time so that the ratio of the total mixed fluid supply time relative to the total fluid supply time may be large. On the other hand, the amount of the dry vapor necessary for drying decreases after the amount of the cleaning water wetting the surface of the wafer 2 has decreased. Therefore the condensation of the dry vapor on the surface of the wafer 2 can be prevented and the wafer 2 can be satisfactorily dried by reducing the ratio of the total mixed fluid supply time relative to the total fluid supply time.

When the substrate processing system carries out the drying process, the fluid supply mechanism 78 supply the mixed fluid containing the carrier gas and the dry vapor for a predetermined time, and then repeats carrier gas supply and mixed fluid supply alternately after the predetermined time has elapsed or changes the mixed fluid supply time and the carrier gas supply time, i.e., changes the ratio of the total mixed fluid supply time relative to the total fluid supply time, in order to change the conditions of the drying process according to the condition of the wafers 2.

Although the present invention has been described as applied to the batch-processing substrate processing system 1, the present invention may be applied to an independent drying apparatus and to a single-wafer processing system.

The present invention dries workpieces placed in a processing tank satisfactorily by intermittently supplying a dry vapor into the processing tank. Therefore, the drying process of the present invention differs in object, constitution and effect from a drying process having an effect of maintaining the Marangoni effect as means for supplying a drying liquid to the surface of a cleaning liquid layer so as to supplement the drying liquid in a Marangoni drying process using the Marangoni effect of a drying liquid layer formed over the surface of a cleaning liquid. However, the drying process using Marangoni drying is the same in object, constitution and effect as the drying process of the present invention and is within the scope of the present invention if the former drying process performs intermittently supplying a dry vapor to the workpieces in combination with drying process using the Marangoni effect.

What is claimed is:
1. A drying apparatus comprising:
a processing tank to receive a workpiece;
a fluid supply mechanism joined to the processing tank to supply a carrier gas and a dry vapor into the processing tank; and
a control device for controlling a supply of the carrier gas and a supply of the dry vapor by the fluid supply mechanism so as to process the workpiece placed in the processing tank such that a carrier gas supply step of supplying the carrier gas while stopping the supply of the dry vapor and a mixed fluid supply step of supplying the carrier gas while supplying the dry vapor are executed alternately and continuously to supply the carrier gas continuously and to supply the dry vapor intermittently, and such that a total mixed fluid supply time for which the mixed fluid supply step is executed is not shorter than 57% of a total processing time for which the carrier gas supply step and the mixed fluid supply step are executed.

2. The drying apparatus according to claim 1, wherein the supply of the carrier gas and the supply of the dry vapor are controlled such that the total mixed fluid supply time for which the mixed fluid supply step is executed is not shorter than 75% of the total processing time for which the carrier gas supply step and the mixed fluid supply step are executed.

3. The drying apparatus according to claim 1, wherein the supply of the carrier gas and the supply of the dry vapor are controlled such that the total mixed fluid supply time for which the mixed fluid supply step is executed is not longer than 83% of the total processing time for which the carrier gas supply step and the mixed fluid supply step are executed.

4. The drying apparatus according to claim 1, wherein the supply of the carrier gas and the supply of the dry vapor are controlled such that the carrier gas supply step and the mixed fluid supply step are executed continuously and alternately.

5. The drying apparatus according to claim 1, wherein the fluid supply mechanism comprises:
a gas supply pipe extending to the processing tank to supply the carrier gas into the processing tank;
a chemical source to supply a chemical, the chemical to be evaporated to generate the dry vapor;
a chemical supply pipe joined to the chemical source and a middle part of the gas supply pipe;
a heating mechanism placed in a part of the gas supply pipe on the downstream side of a joint of the chemical supply pipe and the gas supply pipe to heat a fluid flowing through the gas supply pipe; and
an intermittent chemical supply mechanism placed in the chemical supply pipe to supply the chemical intermittently into the gas supply pipe from the chemical supply pipe.

6. The drying apparatus according to claim 5, wherein the fluid supply mechanism further comprises a preheating mechanism placed in a part of the gas supply pipe on the upstream side of the joint of the gas supply pipe and the chemical supply pipe to heat the carrier gas flowing through the gas supply pipe.

7. The drying apparatus according to claim 6, wherein the gas supply pipe is branched into a plurality of branch pipes, an end of the chemical supply pipe is branched into a plurality of branch pipes and the branch pipes of the chemical supply pipe are connected to the branch pipes of the gas supply pipe, respectively, and
the heating mechanism comprises a plurality of heating mechanisms and the heating mechanisms are placed in the branch pipes of the gas supply pipe, respectively.

8. A substrate processing system comprising:
a cleaning tank to receive a workpiece and to clean the workpiece;

a drying tank to receive the workpiece and to dry the cleaned workpiece received therein;

a fluid supply mechanism joined to the drying tank to supply a carrier gas and a dry vapor into the drying tank; and a control device for controlling a supply of the carrier gas and a supply of the dry vapor by the fluid supply mechanism to dry the workpiece placed in the diying tank such that a carrier gas supply step of supplying the carrier gas while stopping the supply of the dry vapor and a mixed fluid supply step of supplying the carrier gas while supplying the dry vapor are executed alternately and continuously to supply the carrier gas continuously and to supply the dry vapor intermittently, and such that a total mixed fluid supply time for which the mixed fluid supply step is executed is not shorter than 57% of a total processing time for which the carrier gas supply step and the mixed fluid supply step are executed.

9. A substrate drying method comprising the steps of:
placing a workpiece in a processing tank; and
drying the workpiece by intermittently supplying a mixed fluid including a carrier gas and a dry vapor into the processing tank in which the workpiece is placed;
wherein the step of drying the workpiece includes a carrier gas supply step of supplying the carrier gas while stopping the supply of the dry vapor, and a mixed fluid supply step of supplying the carrier gas while supplying the dry vapor,
the carrier gas supply step and the mixed fluid supply step are executed, alternately and continuously so as to supply the carrier gas continuously and so as to supply the dry vapor intermittently, and
a total mixed fluid supply time for which the mixed fluid supply step is executed is not shorter than 57% of a total processing time for which the carrier gas supply step and the mixed fluid supply step are executed.

10. The drying method according to claim 9, wherein the total mixed fluid supply time for which the mixed fluid supply step is executed is not shorter than 75% of the total processing time for which the carrier gas supply step and the mixed fluid supply step are executed.

11. The drying method according to claim 9, wherein the total mixed fluid supply time for which the mixed fluid supply step is executed is not longer than 83% of the total processing time for which the carrier gas supply step and the mixed fluid supply step are executed.

12. The drying method according to claim 9, wherein during the step of drying the workpiece, the carrier gas is supplied continuously and the dry vapor is supplied intermittently whereby the mixed fluid is supplied intermittently.

13. The drying method according to claim 9, wherein the mixed fluid supplied into the processing tank is produced by mixing a chemical to be evaporated to generate the dry vapor and the carrier gas, and heating the chemical and the carrier gas so as to evaporate the chemical.

14. The drying method according to claim 13, wherein the carrier gas is preheated before the carrier gas and the chemical is mixed.

15. A substrate processing method comprising the steps of:
placing a workpiece in a cleaning tank;
cleaning the workpiece placed in the cleaning tank;
placing the cleaned workpiece in a drying tank; and
drying the workpiece by intermittently supplying a mixed fluid including a carrier gas and a dry vapor into the drying tank in which the workpiece is placed;
wherein the step of drying the workpiece includes a carrier gas supply step of supplying the carrier gas while stopping the supply of the dry vapor, and a mixed fluid supply step of supplying the carrier gas while supplying the dry vapor,
the carrier gas supply step and the mixed fluid supply step are executed alternately and continuously so as to supply the carrier gas continuously and so as to supply the dry vapor intermittently, and
a total mixed fluid supply time for which the mixed fluid supply step is executed is not shorter than 57% of a total processing time for which the carrier gas supply step and the mixed fluid supply step are executed.

16. A storage medium storing a program to be carried out by a control device for controlling a drying apparatus including a processing tank to receive a workpiece, and a fluid supply mechanism to supply a carrier gas and a dry vapor into the processing tank; said control device being capable of carrying out the program to accomplish a substrate drying method including the steps of:
placing a workpiece in the processing tank; and
drying the workpiece by intermittently supplying a mixed fluid including a carrier gas and a dry vapor into the processing tank in which the workpiece is placed;
wherein the step of drying the workpiece includes a carrier gas supply step of supplying the carrier gas while stopping the supply of the dry vapor and a mixed fluid supply step of supplying the carrier gas while supplying the dry vapor, the carrier gas supply step and the mixed fluid supply step are executed, alternately and continuously so as to supply the carrier gas continuously and so as to supply the dry vapor intermittently, and a total mixed fluid supply time for which the mixed fluid supply step is executed is not shorter than 57% of a total processing time for which the carrier gas supply step and the mixed fluid supply step are executed.

* * * * *